United States Patent
Kawai

(10) Patent No.: US 11,327,468 B2
(45) Date of Patent: May 10, 2022

(54) CONTROL DEVICE

(71) Applicant: OMRON Corporation, Kyoto (JP)

(72) Inventor: Wakahiro Kawai, Konan (JP)

(73) Assignee: OMRON CORPORATION, Kyoto (JP)

( * ) Notice: Subject to any disclaimer, the term of this patent is extended or adjusted under 35 U.S.C. 154(b) by 377 days.

(21) Appl. No.: 16/465,155

(22) PCT Filed: Oct. 16, 2017

(86) PCT No.: PCT/JP2017/037324
§ 371 (c)(1),
(2) Date: May 30, 2019

(87) PCT Pub. No.: WO2018/138978
PCT Pub. Date: Aug. 2, 2018

(65) Prior Publication Data
US 2021/0278824 A1 Sep. 9, 2021

(30) Foreign Application Priority Data

Jan. 25, 2017 (JP) .............................. JP2017-011125

(51) Int. Cl.
*G05B 19/418* (2006.01)
*B33Y 50/02* (2015.01)
(Continued)

(52) U.S. Cl.
CPC ...... *G05B 19/41805* (2013.01); *B29C 64/393* (2017.08); *B33Y 40/20* (2020.01);
(Continued)

(58) Field of Classification Search
None
See application file for complete search history.

(56) References Cited

U.S. PATENT DOCUMENTS 5,262,954 A 11/1993 Fujino et al.
5,371,940 A 12/1994 Suzuki et al.
(Continued)

FOREIGN PATENT DOCUMENTS

CN 101408759 A 4/2009
CN 101779183 A 7/2010
(Continued)

OTHER PUBLICATIONS

An English translation of the International Search Report ("ISR") of PCT/JP2017/037324 dated Jan. 9, 2018.
(Continued)

*Primary Examiner* — Jason Lin
(74) *Attorney, Agent, or Firm* — Metrolex IP Law Group, PLLC

(57) ABSTRACT

When a specification setting unit sets a specification of a lot number "k+1" after setting a specification of a lot number "k", a mounting program selector performs a mounting program corresponding to the lot number "k", and then selects a mounting program corresponding to the lot number "k+1" according to matching between a mounting number from the mounting program and a planned number of products of the lot number "k". A printing program selector selects a printing program corresponding to the lot number "k", and then selects a printing program corresponding to the lot number "k+1" according to matching between a sum of a printing number from the printing program and a defective product number and the planned number of products of the lot number "k". Consequently, on-demand production of an electronic device can easily be manufactured on a manufacturing line.

16 Claims, 18 Drawing Sheets

(51) Int. Cl.
    *B29C 64/393* (2017.01)
    *H05K 13/08* (2006.01)
    *B33Y 40/20* (2020.01)
    *B33Y 80/00* (2015.01)
    *H01L 21/56* (2006.01)
    *H01L 23/00* (2006.01)
    *H05K 1/18* (2006.01)
    *H05K 3/12* (2006.01)

(52) U.S. Cl.
    CPC .......... *B33Y 50/02* (2014.12); *H05K 13/0882* (2018.08); *B33Y 80/00* (2014.12); *G05B 2219/45026* (2013.01); *G05B 2219/45244* (2013.01); *H01L 21/565* (2013.01); *H01L 21/568* (2013.01); *H01L 24/03* (2013.01); *H01L 24/82* (2013.01); *H01L 2224/03312* (2013.01); *H01L 2224/82102* (2013.01); *H05K 1/185* (2013.01); *H05K 3/125* (2013.01); *H05K 2203/1469* (2013.01)

(56) References Cited

U.S. PATENT DOCUMENTS

| | | | | |
|---|---|---|---|---|
| 5,832,600 | A * | 11/1998 | Hashimoto | H05K 3/403 29/841 |
| 5,910,010 | A * | 6/1999 | Nishizawa | H01L 23/49575 438/15 |
| 6,147,876 | A * | 11/2000 | Yamaguchi | H01L 23/24 257/698 |
| 6,344,974 | B1 * | 2/2002 | Hirata | H05K 3/0052 361/764 |
| 6,572,702 | B1 | 6/2003 | Freeman et al. | |
| 6,890,635 | B2 | 5/2005 | Lin et al. | |
| 7,489,520 | B2 * | 2/2009 | Ha | G02F 1/13452 361/793 |
| 10,542,651 | B2 * | 1/2020 | Mori | H05K 3/341 |
| 2003/0189259 | A1 * | 10/2003 | Kurita | H01L 25/0657 257/777 |
| 2004/0218808 | A1 * | 11/2004 | Prince | G01N 21/95607 382/150 |
| 2005/0118750 | A1 * | 6/2005 | Baba | H05K 1/187 438/128 |
| 2006/0240664 | A1 | 10/2006 | Wada et al. | |
| 2011/0032185 | A1 | 2/2011 | Yamamoto et al. | |
| 2013/0075959 | A1 | 3/2013 | Ohya et al. | |
| 2013/0140649 | A1 | 6/2013 | Rogers et al. | |
| 2015/0201491 | A1 | 7/2015 | Tatsuta | |
| 2015/0241288 | A1 | 8/2015 | Keen et al. | |
| 2016/0282806 | A1 | 9/2016 | Asaoka et al. | |
| 2017/0103950 | A1 | 4/2017 | Kawai | |
| 2018/0079138 | A1 | 3/2018 | Tanaka | |
| 2018/0175158 | A1 | 6/2018 | Rogers et al. | |

FOREIGN PATENT DOCUMENTS

| | | |
|---|---|---|
| CN | 102712121 A | 10/2012 |
| CN | 104472023 A | 3/2015 |
| CN | 104661762 A | 5/2015 |
| CN | 106019908 A | 10/2016 |
| CN | 104661762 B | 11/2016 |
| DE | 69124133 T2 | 8/1997 |
| EP | 0456218 B1 | 1/1997 |
| JP | H10-335895 A | 12/1998 |
| JP | 2004-345322 A | 12/2004 |
| JP | 2006-270118 A | 10/2006 |
| JP | 2014-067847 A | 4/2014 |
| JP | 2016-182745 A | 10/2016 |
| TW | 200630607 A | 9/2006 |
| TW | 200808146 A | 2/2008 |
| TW | I333543 B | 11/2010 |
| TW | 201546429 A | 12/2015 |
| TW | 201618377 A | 5/2016 |
| WO | 2015/163082 A1 | 10/2015 |
| WO | 2016/053501 A1 | 4/2016 |

OTHER PUBLICATIONS

A copy of the written opinion("WO") of the international searching authority of PCT/JP2017/037324 dated Jan. 9, 2018.

The Taiwanese Notice of Allowance ("TW NOA") letter dated Nov. 27, 2018 in a counterpart Taiwanese patent application.

An Extended European Search Report dated Oct. 7, 2020 in an counterpart European patent application.

An Office Action (CNOA) dated Aug. 24, 2021 in a counterpart Chinese patent application.

* cited by examiner

FIG.5

| CUSTOMIZATION INFORMATION | | | | PROGRAM INFORMATION | |
|---|---|---|---|---|---|
| LED | | BUZZER | ... | MOUNTING PROGRAM NUMBER | PRINTING PROGRAM NUMBER |
| COLOR | NUMBER | | | | |
| RED | 3 | PRESENCE | ... | mp0001 | pp0001 |
| RED | 4 | ABSENCE | ... | mp0002 | pp0002 |
| ... | ... | ... | ... | ... | ... |

FIG.6

| LOT NUMBER | MOUNTING PROGRAM NUMBER | PRINTING PROGRAM NUMBER | PLANNED NUMBER OF PRODUCTS | MOUNTING STATUS INFORMATION | SHAPING STATUS INFORMATION | PRINTING STATUS INFORMATION |
|---|---|---|---|---|---|---|
| ... | ... | ... | ... | ... | ... | ... |
| k−1 | mp0090 | pp0090 | 100 | COMPLETED | COMPLETED | COMPLETED |
| k | mp0001 | pp0001 | 100 | IN PROCESS | IN PROCESS | IN PROCESS |
| k+1 | mp0250 | pp0300 | 50 | UNPROCESSED | UNPROCESSED | UNPROCESSED |

FIG.7

| MOUNTING PROGRAM NUMBER: mp0001 | | |
|---|---|---|
| PART NUMBER | POSITION | ORIENTATION |
| led0001 | x1, y1 | 0 DEGREES |
| ic0002 | x2, y2 | 90 DEGREES |
| ⋮ | ⋮ | ⋮ |

MOUNTING PROGRAM NUMBER: mp0002

MOUNTING PROGRAM NUMBER: mp0003

| LOT NUMBER | MOUNTING NUMBER |
|---|---|
| ⋮ | ⋮ |
| k−1 | 100/100 |
| k | 95/100 |
| k+1 | 0/50 |

FIG.9

| LOT NUMBER | MOUNTING NUMBER | DEFECTIVE PRODUCT NUMBER |
|---|---|---|
| ⋮ | ⋮ | ⋮ |
| k−1 | 100/100 | 2/100 |
| k | 94/100 | 1/100 |
| k+1 | 0/50 | 0/50 |

FIG.10
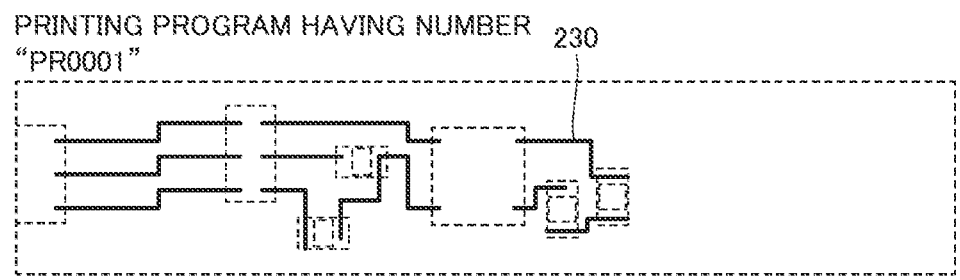
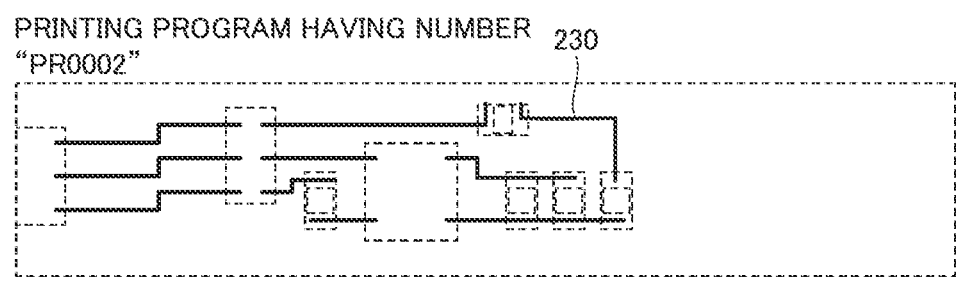
FIG.11
| LOT NUMBER | PRINTING NUMBER |
|---|---|
| ⋮ | ⋮ |
| k−1 | 98 |
| k | 92 |
| k+1 | 0 |

FIG.17

| MOUNTING PROGRAM NUMBER:mp0002 | | |
|---|---|---|
| MOUNTING PROGRAM SUB-NUMBER:mp0001(2) | | |
| MOUNTING PROGRAM SUB-NUMBER:mp0001(1) | | |
| PART NUMBER | POSITION | ORIENTATION |
| led0001 | x1, y1 | 0 DEGREES |
| ic0002 | x2, y2 | 90 DEGREES |
| ⋮ | ⋮ | ⋮ |

FIG.18

| MOUNTING PROGRAM SUB-NUMBER | PRINTING PROGRAM SUB-NUMBER |
|---|---|
| mp1001(1) | pp1001(1) |
| mp1001(2) | pp1001(2) |
| ⋮ | ⋮ |

FIG.19

| LOT NUMBER | MOUNTING PROGRAM NUMBER | PRINTING PROGRAM NUMBER | PLANNED NUMBER OF PRODUCTS | MOUNTING STATUS INFORMATION | SHAPING STATUS INFORMATION | PRINTING STATUS INFORMATION |
|---|---|---|---|---|---|---|
| ... | ... | ... | ... | ... | ... | ... |
| k−1 | mp0090 | pp0090 | 100 | COMPLETED | COMPLETED | COMPLETED |
| k(1) | mp0001 | pp0001 | 50 | IN PROCESS | IN PROCESS | IN PROCESS |
| k(2) | mp0001 | pp0001 | 50 | UNPROCESSED | UNPROCESSED | UNPROCESSED |
| k+1 | mp0250 | pp0300 | 50 | UNPROCESSED | UNPROCESSED | UNPROCESSED |

FIG.21

| CUSTOMIZATION INFORMATION | | | | | PROGRAM INFORMATION | | |
|---|---|---|---|---|---|---|---|
| LED | | BUZZER | SHAPED RESIN BODY | | ... | MOUNTING PROGRAM NUMBER | SHAPING PROGRAM NUMBER | PRINTING PROGRAM NUMBER |
| COLOR | NUMBER | | COLOR | SHAPE | | | | |
| RED | 3 | PRESENCE | WHITE | A TYPE | ... | mp0001 | fp0001 | pp0001 |
| RED | 4 | ABSENCE | BLACK | B TYPE | ... | mp0002 | fp0002 | pp0002 |
| ... | ... | ... | ... | ... | ... | ... | ... | ... |

FIG.22

| LOT NUMBER | MOUNTING PROGRAM NUMBER | SHAPING PROGRAM NUMBER | PRINTING PROGRAM NUMBER | PLANNED NUMBER OF PRODUCTS | MOUNTING STATUS INFORMATION | SHAPING STATUS INFORMATION | PRINTING STATUS INFORMATION |
|---|---|---|---|---|---|---|---|
| ... | ... | ... | ... | ... | ... | ... | ... |
| k−1 | mp0090 | fp0090 | pp0090 | 100 | COMPLETED | COMPLETED | COMPLETED |
| k | mp0001 | fp0001 | pp0001 | 100 | IN PROCESS | IN PROCESS | IN PROCESS |
| k+1 | mp0250 | fp0250 | pp0300 | 50 | UNPROCESSED | UNPROCESSED | UNPROCESSED |

CONTROL DEVICE

TECHNICAL FIELD

The present technique relates to a control device that controls a manufacturing line for manufacturing an electronic device including a shaped resin body in which an electronic component is embedded.

BACKGROUND ART

In recent years, due to diversification of tastes and preferences at a consumer level, and diversification of sensors with expansion of an IoT (Internet of Things) market, a demand for small lot production of many products of electronic instruments fitting to a need is increasingly enhanced. That is, the demand for on-demand production of electronic devices fitting to the need is increasingly enhanced.

A printed circuit board on which electronic components are mounted is typically manufactured by photolithography or screen printing. In the photolithography method, a wiring is formed by performing coating of a resist on a conductive layer, exposure using a photomask having a wiring pattern, dissolution and removal of the unexposed resist, and etching of the conductive layer in a portion that is not covered with the resist. In the screen printing method, the wiring is formed by printing a conductive paste using printing plate making. In order to manufacture the printed circuit board, it is necessary to previously prepare a photomask or printing plate making. For this reason, for the electronic instrument in which the printed circuit board is used, the wiring pattern of the printed circuit board is hardly changed in a short time according to the need, and the requirement of high-mix low-volume production cannot sufficiently be coped with.

As measures against such problems, Japanese Patent Laying-Open No. 2004-345322 (PTL 1) and Japanese Patent Laying-Open No. 2006-270118 (PTL 2) propose a method for preparing the wiring pattern by an inkjet printer in which the photomask or the printing plate making is not required in order to perform the on-demand production.

CITATION LIST

Patent Literature

PTL 1: Japanese Patent Laying-Open No. 2004-345322
PTL 2: Japanese Patent Laying-Open No. 2006-270118

SUMMARY OF INVENTION

Technical Problem

However, in the techniques described in Japanese Patent Laying-Open Nos. 2004-345322 and 2006-270118, it is necessary to mount the electronic component on the circuit pattern after the circuit pattern is formed on the printed circuit board. A high-temperature heat treatment associated with soldering during mounting of the electronic component generates a problem in that a material that can be used for the printed circuit board is restricted. It is necessary to switch work conditions and programs of many post-processes such as solder paste printing, electronic component mounting, and a reflow furnace for each product type, which results in a problem in that switching work becomes complicated.

The present invention has been made in view of the above-mentioned problems of the prior art, and it is an object of the present invention to provide a control device that can easily perform the on-demand production of the electronic device on a manufacturing line.

Solution to Problem

According to one aspect of the present invention, a control device controls a manufacturing line including: a mounter configured to place at least one electronic component of a designated type at a designated position; a resin shaping machine configured to shape into a shaped resin body in which the at least one electronic component disposed at the designated position is embedded; and a printing machine configured to form a wiring on a surface of the shaped resin body by ejecting conductive ink according to a designated pattern. The control device includes: a specification setting unit configured to set a specification of a product to be manufactured through the manufacturing line and a planned number of products; a mounting program selector configured to select a mounting program to be used by the mounter from a plurality of mounting programs indicating the type and the position of the at least one electronic component; a first counter configured to count a mounting number from the mounter using the mounting program, for each of the mounting programs selected by the mounting program selector; a second counter configured to count a defective product number of the shaped resin body in which the at least one electronic component disposed using the mounting program is embedded for each of the mounting programs; a printing program selector configured to select a printing program to be used by the printing machine from a plurality of printing programs indicating the pattern; and a third counter configured to count a printing number from the printing machine using the printing program, for each of the printing programs selected by the printing program selector. When the specification setting unit sets a first specification and a first planned number of products, and then sets a second specification and a second planned number of products, the mounting program selector is configured to select a first mounting program corresponding to the first specification, and then select a second mounting program corresponding to the second specification according to matching between the mounting number corresponding to the first mounting program and the first planned number of products. The printing program selector is configured to select a first printing program corresponding to the first specification, and then select a second printing program corresponding to the second specification according to matching between (i) a sum of the printing number corresponding to the first printing program and the defective product number corresponding to the first mounting program and (ii) the first planned number of products.

Preferably, when the mounting program selected by the mounting program selector indicates the types and the positions of a plurality of electronic components, the first counter is configured to increment the mounting number by one, each time the first counter receives from the mounter a mounting completion signal indicating that dispositions of the plurality of electronic components are completed.

Preferably, the third counter is configured to increment the printing number by one, each time the third counter receives a printing start signal from the printing machine.

Preferably, the plurality of mounting programs include at least two mounting programs corresponding to a third specification. When the specification setting unit sets the third specification and a third planned number of products, the mounting program selector is configured to arbitrarily select one mounting program from the at least two mounting programs.

Preferably, the plurality of printing programs include at least two printing programs corresponding to the third specification. When the specification setting unit sets the third specification and the third planned number of products, the printing program selector is configured to select the printing program corresponding to the mounting program selected by the mounting program selector from the at least two printing programs.

Preferably, the plurality of mounting programs include at least two mounting programs corresponding to a third specification. When the specification setting unit sets the third specification and the third planned number of products, the specification setting unit is configured to set the planned number of products for each of the at least two mounting programs such that a total of the planned numbers of products of the at least two mounting programs becomes a third planned number of products. The at least two mounting programs include a third mounting program and a fourth mounting program. When the specification setting unit sets the third specification and the third planned number of products, the mounting program selector is configured to select the third mounting program, and then select the fourth mounting program according to matching between the mounting number corresponding to the third mounting program and the planned number of products set for the third mounting program.

Preferably, the plurality of printing programs include a third printing program corresponding to the third mounting program and a fourth printing program corresponding to the fourth mounting program. When the specification setting unit sets the third specification and the third planned number of products, the printing program selector is configured to select the third printing program, and then select the fourth printing program according to matching between (i) a sum of the printing number corresponding to the third printing program and the defective product number corresponding to the third mounting program and (ii) the planned number of products set for the third mounting program.

Preferably, the at least one electronic component is divided into a plurality of groups. The at least two mounting programs differ from each other in dispositions of the plurality of groups.

Preferably, the resin shaping machine is an injection molding machine using a molding die.

Preferably, the resin shaping machine is a 3D printer configured to shape into the shaped resin body having a designated shape. The control device further includes: a shaping program selector configured to select a shaping program to be used by the resin shaping machine from a plurality of shaping programs indicating the shape of the shaped resin body; and a fourth counter configured to count a shaping number from the resin shaping machine using the shaping program, for each of the shaping programs selected by the shaping program selector. When the specification setting unit sets the first specification and the first planned number of products, and then sets the second specification and the second planned number of products, the shaping program selector is configured to select a first shaping program corresponding to the first specification, and then select a second shaping program corresponding to the second specification according to matching between the shaping number corresponding to the first shaping program and the first planned number of products.

Preferably, the resin shaping machine is a 3D printer configured to shape into the shaped resin body of a designated resin material. The control device further includes: a shaping program selector configured to select a shaping program to be used by the resin shaping machine from a plurality of shaping programs indicating a type of a resin material for the shaped resin body; and a fourth counter configured to count a shaping number from the resin shaping machine using the shaping program, for each of the shaping programs selected by the shaping program selector. When the specification setting unit sets the first specification and the first planned number of products, and then sets the second specification and the second planned number of products, the shaping program selector is configured to select a first shaping program corresponding to the first specification, and then select a second shaping program corresponding to the second specification according to matching between the shaping number corresponding to the first shaping program and the first planned number of products.

Advantageous Effects of Invention

In the present disclosure, the on-demand production of the electronic device can easily be manufactured on the manufacturing line.

BRIEF DESCRIPTION OF DRAWINGS

FIG. 5 is a view illustrating an example of a specification table stored in a storage of the control device in FIG. 4.

FIG. 6 is a view illustrating an example of a lot management table stored in the storage of FIG. 4.

FIG. 7 is a view illustrating an example of a mounting program group stored in the storage of FIG. 4.

FIG. 8 is a view illustrating an example of mounting number data stored in the storage of FIG. 4.

FIG. 9 is a view illustrating an example of shaping number data stored in the storage of FIG. 4.

FIG. 10 is a view illustrating an example of a wiring pattern indicated by a printing program group stored in the storage of FIG. 4.

FIG. 11 is a view illustrating an example of printing number data stored in the storage of FIG. 4.

FIG. 17 is a view illustrating an example of a mounting program group stored in a storage of the control device in FIG. 16.

FIG. 18 is a view illustrating an example of a combination table stored in the storage of FIG. 16.

FIG. 19 is a view illustrating a modification of a lot management table stored in the storage of FIG. 16.

FIG. 21 is a view illustrating an example of a specification table stored in a storage of the control device in FIG. 20.

FIG. 22 is a view illustrating an example of a lot management table stored in the storage of FIG. 20.

DESCRIPTION OF EMBODIMENTS

Figure 1:
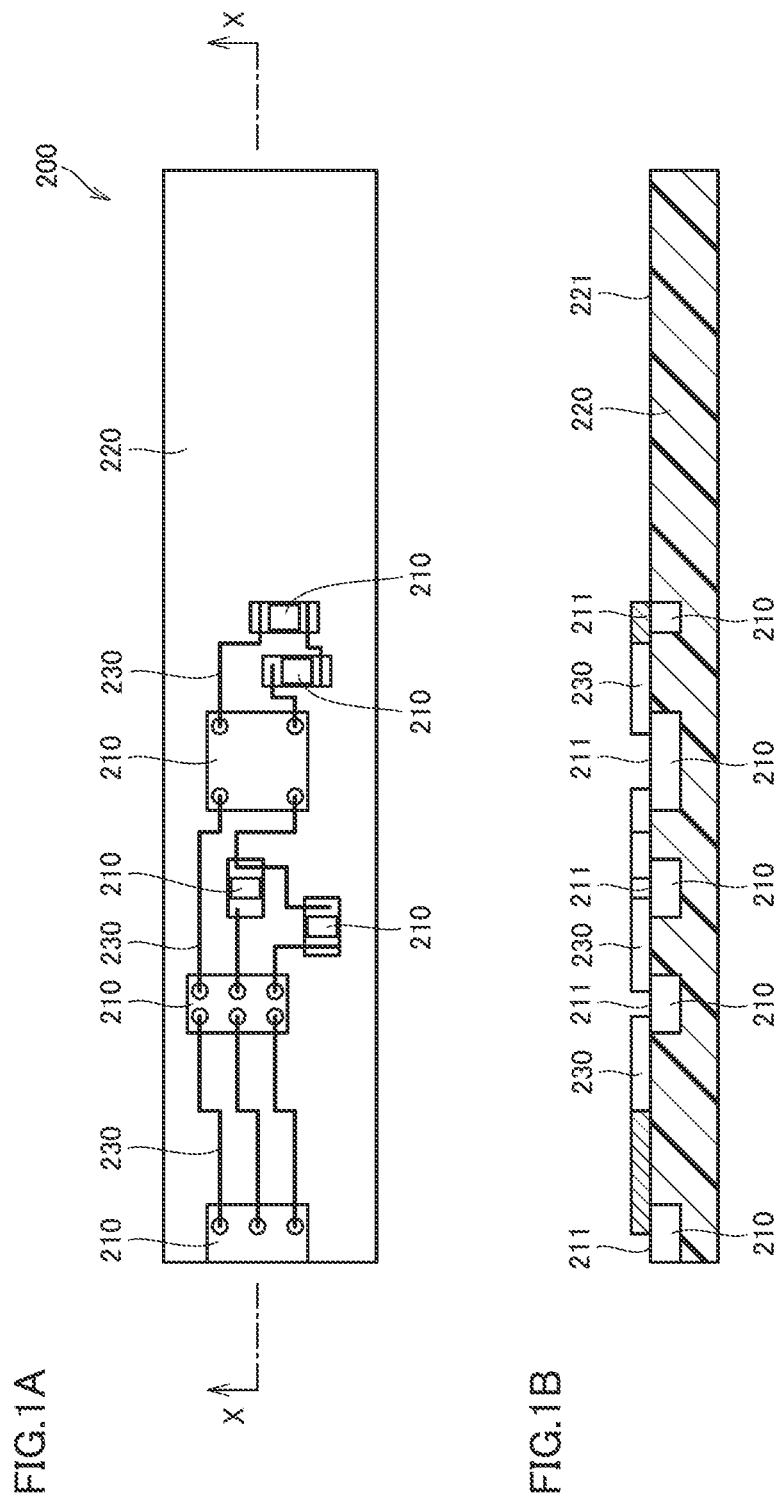
FIG. 1A is a plan view illustrating an example of an electronic device manufactured through a manufacturing line according to a first embodiment.
FIG. 1B is a sectional view taken along line X-X in FIG. 1A.

Embodiments of the present invention will be described in detail with reference to the drawings. The same or equivalent portions in the drawings are denoted by the same reference numerals, and the description will not be repeated. The following embodiments or modifications may selectively be combined as appropriate.

First Embodiment (Configuration of Electronic Device)

With reference to FIGS. 1A and 1B, an electronic device 200 manufactured by a manufacturing line according to a first embodiment will be described. FIG. 1A is a plan view illustrating an example of electronic device 200. FIG. 1B is a sectional view taken along line X-X in FIG. 1A.

As illustrated in FIGS. 1A and 1B, electronic device 200 includes an electronic component 210, a shaped resin body 220, and a wiring 230.

Electronic component 210 is a semiconductor component such as an IC, an LSI (Large-Scale Integration), and a power transistor, a light emitting element such as an LED (Light Emitting Diode), a passive component such as a resistor and a capacitor, various sensors, a switch, a display, a buzzer, a connector, and the like. Although seven electronic components 210 are illustrated in the example of FIGS. 1A and 1B, the number of electronic components 210 included in electronic device 200 is not particularly limited, but may be one to six, or at least eight. A type of electronic component 210 is also not particularly limited.

Shaped resin body 220 has a substantial plate shape, and is made of resin such as polycarbonate (PC) and acrylonitrile butadiene styrene (ABS). The shape and the material of shaped resin body 220 are not particularly limited.

Electronic component 210 is embedded in shaped resin body 220, thereby fixing electronic component 210. However, electronic component 210 is exposed to an upper surface 221 of shaped resin body 220. An electrode is formed on an exposed surface 211 of electronic component 210 from shaped resin body 220. Upper surface 221 of shaped resin body 220 and exposed surface 211 of electronic component 210 are substantially flush with each other. That is, upper surface 221 of shaped resin body 220 is continuous with exposed surface 211 of electronic component 210. As used herein, the term "two surfaces are continuous with each other" means that a level difference between the two surfaces is so small that wiring 230 formed on the level difference is not cut.

Wiring 230 is made of a conductive material such as silver (Ag) and copper (Cu), formed on upper surface 221 of shaped resin body 220, and connected to an electrode of electronic component 210. Upper surface 221 of shaped resin body 220 and exposed surface 211 of electronic component 210 are continuous with each other, so that wiring 230 can easily be formed by ejecting conductive ink (for example, silver (Ag) nanoink) using an inkjet printing method. A width, a thickness, and the like of wiring 230 are not particularly limited.

(Manufacturing Line)

Figure 2:
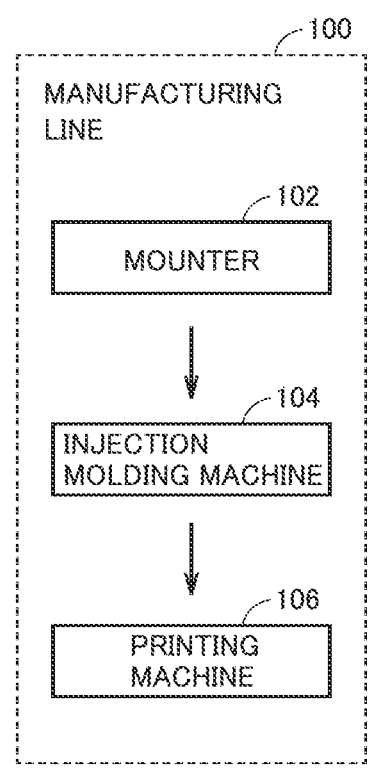
FIG. 2 is a block diagram illustrating a schematic configuration of the manufacturing line of the first embodiment.

With reference to FIG. 2, a manufacturing line 100 for manufacturing electronic device 200 will be described. FIG. 2 is a block diagram illustrating a schematic configuration of manufacturing line 100 of the first embodiment.

As illustrated in FIG. 2, manufacturing line 100 includes a mounter 102, an injection molding machine 104, and a printing machine 106.

Mounter 102 mounts the designated type of electronic component 210 at a designated position and direction on a temporary fixing sheet to which an adhesive is applied.

Injection molding machine 104 places the temporary fixing sheet on which electronic component 210 is mounted by mounter 102 in an inner space of a molding die, and injects resin into the inner space to shape into shaped resin body 220 in which electronic component 210 is embedded.

Printing machine 106 prints wiring 230 having a designated pattern on upper surface 221 of shaped resin body 220 using the inkjet printing method. The ink jet printing method is a printing method in which the conductive ink is ejected from a nozzle according to the designated pattern to deposit particulate ink on an ejection target surface.

(Manufacturing Method)

Figure 3:
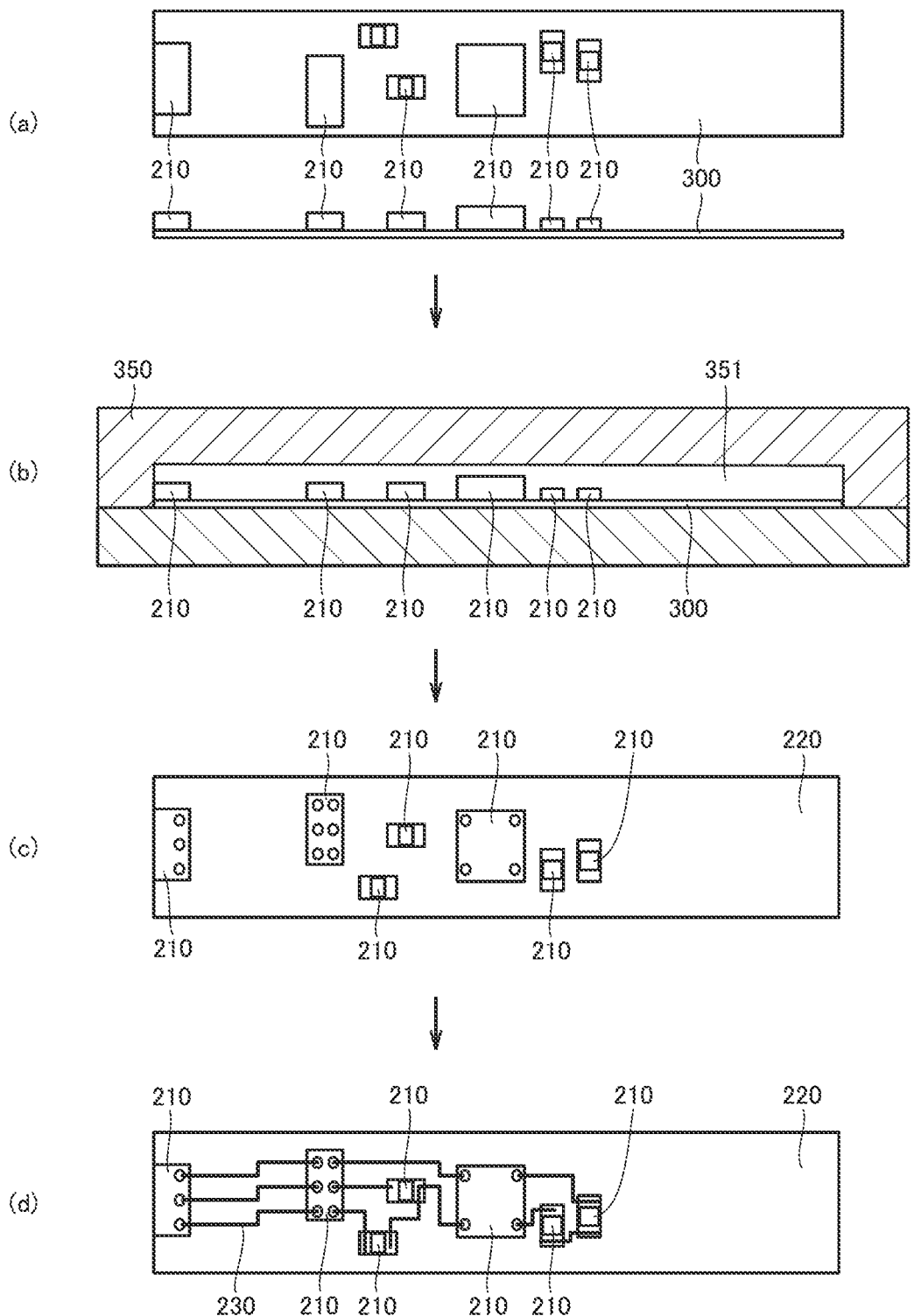
FIG. 3 is a view illustrating a method for manufacturing the electronic device through the manufacturing line.

With reference to FIG. 3, an outline of a method for manufacturing electronic device 200 through manufacturing line 100 will be described. FIG. 3 is a view illustrating the method for manufacturing electronic device 200 through manufacturing line 100. Parts (a) to (d) of FIG. 3 are views illustrating first to fourth steps, respectively. In the part (a) of FIG. 3, an upper stage is a plan view, and a lower stage is a side view. The part (b) of FIG. 3 is a sectional view. The parts (c) and (d) of FIG. 3 are plan views.

[First step] As illustrated in the part (a) of FIG. 3, mounter 102 sticks electronic component 210 onto a temporary fixing sheet 300 having a predetermined shape (in FIG. 3, rectangular shape) using an adhesive (not illustrated). At this point, mounter 102 sticks electronic component 210 onto temporary fixing sheet 300 such that a surface on which the electrode is formed is in contact with temporary fixing sheet 300.

Mounter 102 receives a mounting instruction to which a mounting program is added from the outside. The mounting program specifies the type of electronic component 210 and the position and the orientation of electronic component 210 for each of electronic components 210 stuck to temporary fixing sheet 300. When receiving the next mounting instruction during the mounting processing, mounter 102 temporarily stores the next mounting instruction in a buffer, and starts the mounting processing according to the next mounting instruction after completion of the mounting.

Mounter 102 sticks the designated type of electronic component 210 at the designated position and direction on temporary fixing sheet 300 according to the mounting program. For this reason, the type, the position, and the orientation of electronic component 210 mounted by mounter 102 can easily be customized by switching the mounting program.

For example, polyethylene terephthalate (PET), polyethylene naphthalate (PEN), and polyphenylene sulfide (PPS) can be used as a material for temporary fixing sheet 300. Temporary fixing sheet 300 is preferably made of a material that transmits ultraviolet light and has flexibility.

For example, the temporary fixing can be performed using an ultraviolet-curable adhesive (not illustrated) applied to one of the surfaces of temporary fixing sheet 300. For example, the ultraviolet-curable adhesive is applied by a thickness of 2 μm to 3 μm onto PET temporary fixing sheet 300 having a thickness of 50 μm. This application may be performed by a method such as the inkjet printing method. Mounter 102 cures the adhesive by irradiating the adhesive with the ultraviolet light having strength of, for example, 3000 mJ/cm$^2$ from the surface of temporary fixing sheet 300 on which electronic component 210 is not temporarily fixed, thereby temporary fixing electronic components 210 to temporary fixing sheet 300.

Mounter 102 outputs a mounting completion signal after the completion of the temporary fixing of all electronic components 210 designated by the mounting program to temporary fixing sheet 300. Mounter 102 places temporary fixing sheet 300 on which electronic components 210 are mounted on a conveyance belt, and conveys temporary fixing sheet 300 to injection molding machine 104.

[Second step] Subsequently, as illustrated in the part (b) of FIG. 3, injection molding machine 104 disposes temporary fixing sheet 300 conveyed from mounter 102 in an internal space 351 of a molding die 350. At this point, injection molding machine 104 disposes temporary fixing sheet 300 in molding die 350 such that the surface of temporary fixing sheet 300 on the side to which electronic component 210 is not stuck is in contact with the inner surface of molding die 350.

Injection molding machine 104 injects a resin material into internal space 351 of molding die 350 to perform resin injection molding.

A condition that performs the injection molding may appropriately be selected according to the resin. For example, in the case of using acrylonitrile butadiene styrene (ABS), the injection molding is performed at an injection resin temperature of 180° C. and an injection pressure of 20 kgf/cm$^2$. Various resin materials can be used as the resin to be injection-molded.

[Third step] Subsequently, injection molding machine 104 takes out shaped resin body 220 obtained by the injection molding in the second step from molding die 350, and peels off temporary fixing sheet 300 from shaped resin body 220. Consequently, as illustrated in the part (c) of FIG. 3, the surface of electronic component 210 is exposed from a sheet bonding surface that is in contact with the temporary fixing sheet 300 in shaped resin body 220.

In the case where temporary fixing sheet 300 is a PET film, injection molding machine 104 can easily separate temporary fixing sheet 300 from shaped resin body 220 because temporary fixing sheet 300 is greatly deformed due to a heat change in the second step.

Injection molding machine 104 inspects an external appearance of shaped resin body 220 to determine quality of shaped resin body 220. For example, based on an image obtained by imaging shaped resin body 220, injection molding machine 104 determines whether measurement results of the position of electronic component 210, the shape of shaped resin body 220, and the like fall within a predetermined reference range. When the measurement result fall within the reference range, injection molding machine 104 conveys shaped resin body 220 to printing machine 106 while placing shaped resin body 220 on the conveyance belt, and outputs a signal indicating shaping completion (shaping completion signal). When the measurement results are out of the reference range, injection molding machine 104 discards shaped resin body 220 as a defective product, and outputs the shaping completion signal to which a defective shaping signal indicating the defective product is added.

[Fourth step] Subsequently, as illustrated in the part (d) of FIG. 3, printing machine 106 prints wiring 230 on shaped resin body 220. Printing machine 106 forms wiring 230 by ejecting the conductive ink (for example, silver nanoink) using the inkjet printing method.

Printing machine 106 receives a printing instruction to which a printing program is added from the outside. The printing program designates a pattern to be printed. When receiving the next printing instruction during the printing processing, printing machine 106 temporarily stores the next printing instruction in a buffer, and starts the printing processing according to the next printing instruction after the completion of the currently-performed printing. Printing machine 106 forms wiring 230 according to the pattern indicated by the printing program. For this reason, the pattern of wiring 230 can easily be customized only by switching the printing program.

Printing machine 106 outputs a signal (printing start signal) indicating the start of printing when the printing of wiring 230 is started for each shaped resin body 220.

(Configuration of Control Device)

Figure 4:
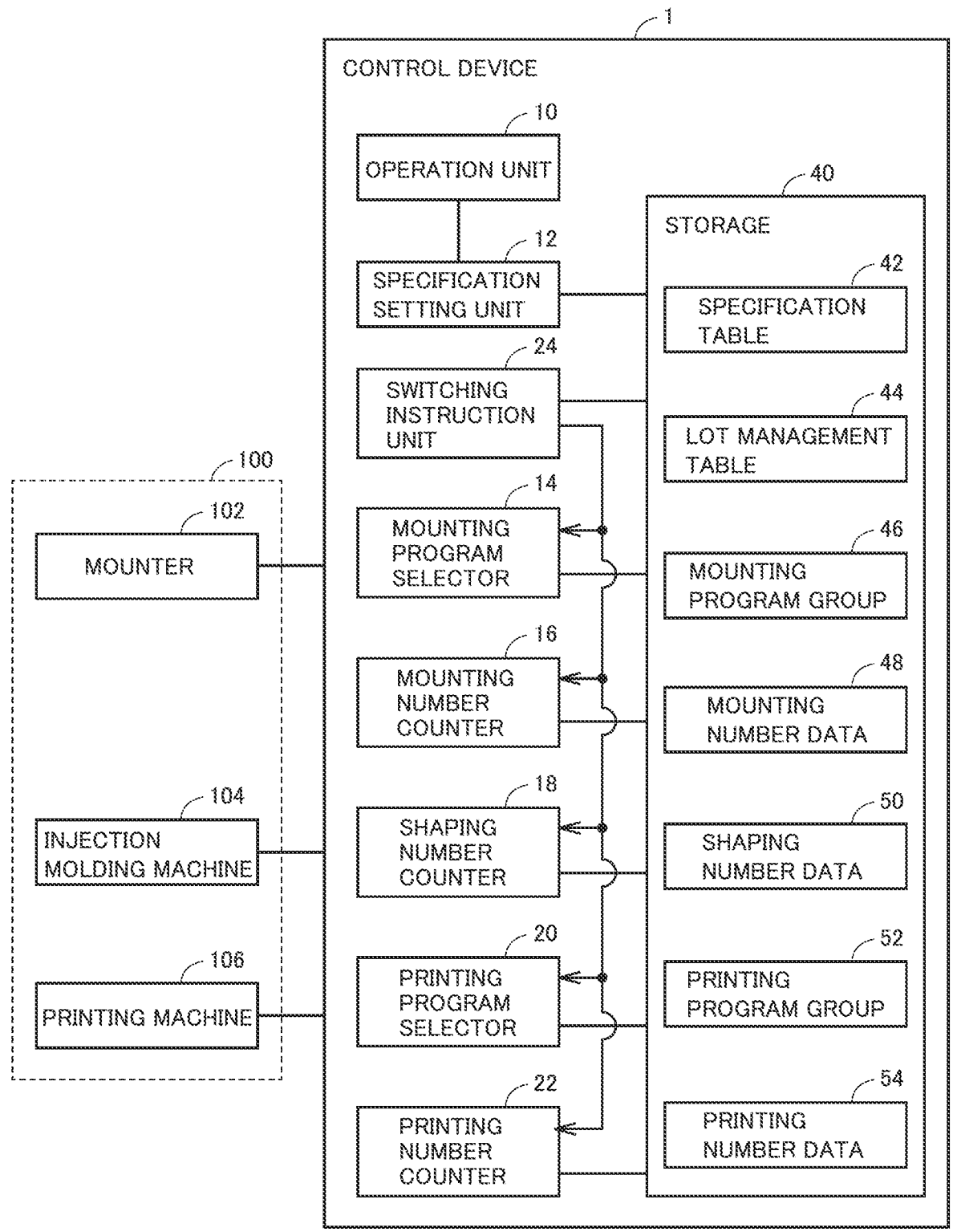
FIG. 4 is a block diagram illustrating a schematic configuration of a control device of the first embodiment.

With reference to FIGS. 4 to 11, a configuration of a control device 1 that controls manufacturing line 100 will be described below. FIG. 4 is a block diagram illustrating a schematic configuration of control device 1. FIG. 5 is a view illustrating an example of a specification table 42 stored in a storage 40 included in control device 1. FIG. 6 is a view illustrating an example of a lot management table 44 stored in storage 40. FIG. 7 is a view illustrating an example of a mounting program group 46 stored in storage 40. FIG. 8 is a view illustrating an example of mounting number data 48 stored in storage 40. FIG. 9 is a view illustrating an example of shaping number data 50 stored in storage 40. FIG. 10 is a view illustrating an example of a wiring pattern indicated by a printing program group 52 stored in storage 40. FIG. 11 is a view illustrating an example of printing number data 54 stored in storage 40.

Control device 1 controls manufacturing line 100 so as to perform on-demand production. Electronic device 200 manufactured through manufacturing line 100 is a device for a specific application, but is customized according to a demand. In the case where a customization instruction does not exist, control device 1 controls manufacturing line 100 so as to manufacture electronic device 200 of a standard specification. In the case where the customization instruction exists, control device 1 controls manufacturing line 100 so as to manufacture electronic device 200 having a specification changed according to the customization instruction.

In the first embodiment, the type, the number, and the position of specific electronic component 210 can be customized, and the shape and the color of shaped resin body 220 cannot be customized. For this reason, injection molding machine 104 shapes into shaped resin body 220 using the same molding die 350 and the same resin material regardless of presence or absence of the customization.

As illustrated in FIG. 4, control device 1 includes an operation unit 10, a specification setting unit 12, a mounting program selector 14, a mounting number counter 16, a shaping number counter 18, and a printing program selector 20, a printing number counter 22, a switching instruction unit 24, and storage 40.

Operation unit 10 receives input of customization information setting the specification of electronic device 200 to be manufactured through manufacturing line 100 and input of the planned number of products. For example, operation unit 10 is configured by a touch panel.

Operation unit 10 receives customization information about customizable electronic component 210 in order to customize the type, the number, and the position of electronic component 210. Examples of the customization information includes information indicating an emission color and the number of LEDs (Light Emitting Diodes) used in electronic device 200, information indicating whether electronic device 200 is equipped with a buzzer, and information indicating the position of an indicator mounted on electronic device 200.

Specification setting unit 12 sets program information indicating the specification of electronic device 200 based on specification table 42 stored in storage 40.

As illustrated in FIG. 5, specification table 42 is a table in which the customization information and the program information are correlated with each other. Specification table 42 is created by a designer of electronic device 200 to be manufactured through manufacturing line 100 or the like, and previously stored in storage 40. In the example of FIG. 5, the customization information includes information indicating the color and the number of LEDs and information indicating presence or absence of the buzzer. The program information includes a mounting program number identifying the mounting program used by mounter 102 during the mounting and a printing program number identifying the printing program used by printing machine 106 during the printing.

Specification setting unit 12 reads the program information corresponding to the customization information received by operation unit 10 from specification table 42, and sets the read program information as information indicating the specification of electronic device 200 to be manufactured.

Specification setting unit 12 adds a new record to lot management table 44 (see FIG. 6) stored in storage 40 each time operation unit 10 receives the customization information and the planned number of products.

As illustrated in FIG. 6, lot management table 44 includes a record in which a lot number, the mounting program number, the printing program number, the planned number of products, mounting status information, shaping status information, and printing status information are correlated with one another.

Specification setting unit 12 sets the lot number according to order in which operation unit 10 receives the customization information and the planned number of products, and produces the record in which the lot number, the program information (the mounting program number and the printing program number) corresponding to the customization information, the planned number of products, the mounting status information, the shaping status information, and the printing status information are correlated with one another.

The mounting status information is information indicating a status of the mounting processing of mounter 102, and indicates one of "unprocessed", "in process", and "completed". The shaping status information is information indicating the status of shaping processing of injection molding machine 104, and indicates one of "unprocessed", "in process", and "completed". The printing status information is information indicating the status of printing processing of printing machine 106, and indicates one of "unprocessed", "in process", and "completed". When adding the new record to lot management table 44, specification setting unit 12 sets the mounting status information, the shaping status information, and the printing status information of the record to "unprocessed".

In the example of FIG. 6, after adding the record of the lot number "k" to lot management table 44, specification setting unit 12 adds the record of the lot number "k+1" to lot management table 44 according to the customization information and the planned number of products, which are newly received by operation unit 10.

In the example of FIG. 6, the mounting processing, the shaping processing, and the printing processing of electronic device 200 corresponding to the lot number "k−1" are completed, the mounting processing, the shaping processing, and the printing processing of electronic device 200 corresponding to the lot number "k" are in progress, and the mounting processing, the shaping processing, and the printing processing of electronic device 200 corresponding to the lot number "k+1" are not performed yet.

Returning to FIG. 4, mounting program selector 14 receives a first switching instruction designating the mounting program number from switching instruction unit 24, and selects the mounting program to be used by mounter 102 according to the first switching instruction. Specifically, mounting program selector 14 selects the mounting program corresponding to the mounting program number designated by the first switching instruction from mounting program group 46. Mounting program selector 14 outputs the mounting instruction, to which the selected mounting program is added, to mounter 102.

As illustrated in FIG. 7, mounting program group 46 includes the mounting program corresponding to each mounting program number. The mounting program indicates a component identification number identifying electronic component 210, a mounting position of electronic component 210, and the orientation of electronic component 210 with respect to electronic component 210 to be mounted. The mounting position of electronic component 210 is indicated by a coordinate on temporary fixing sheet 300. The orientation of electronic component 210 is indicated by an angle from a standard orientation previously set with respect to electronic component 210.

Returning to FIG. 4, mounting number counter 16 receives a first count instruction designating the lot number from switching instruction unit 24, and counts the number of times of the mounting completion signal (mounting number) output from mounter 102 after receiving the first count instruction. Mounting number counter 16 stores mounting number data 48 in which the lot number designated by the first count instruction is correlated with the mounting number counted after the reception of the first count instruction in storage 40.

In the example of FIG. 8, mounting number counter 16 stores mounting number data 48 in which the mounting number is 95 for the lot number "k" in storage 40. A denominator in a field of "mounting number" in FIG. 8 indicates the planned number of products.

Returning to FIG. 4, shaping number counter 18 receives a second count instruction designating the lot number from switching instruction unit 24, and counts the number of times of the shaping completion signal (shaping number) output from injection molding machine 104 after receiving the second count instruction. Shaping number counter 18 also counts the number of times of the defective shaping signal (defective product number) output from injection molding machine 104 after receiving the second count instruction. Shaping number counter 18 stores shaping number data 50 in which the lot number designated by the second count instruction is correlated with the shaping number and the defective product number that are counted after the reception of the second count instruction in storage 40.

In the example of FIG. 9, shaping number counter 18 stores shaping number data 50 indicating that the shaping number is 94 and the defective product number is 1 for the lot number "k" in storage 40. It is found from the shaping number data that one of 94 shaped resin bodies 220 is discarded as the defective product. The denominators in the fields of "shaping number" and "defective product number" in FIG. 9 indicate the planned number of products.

Returning to FIG. 4, printing program selector 20 receives a second switching instruction designating the printing program number from switching instruction unit 24, and selects the printing program to be used by printing machine 106 according to the second switching instruction. Specifically, printing program selector 20 selects the printing program corresponding to the printing program number designated by the second switching instruction from printing program group 52. Printing program selector 20 outputs, to printing machine 106, the printing instruction to which the selected printing program is added.

As illustrated in FIG. 10, each printing program included in printing program group 52 indicates the pattern of wiring 230 to be formed on shaped resin body 220.

Returning to FIG. 4, printing number counter 22 receives a third count instruction designating the lot number from switching instruction unit 24, and counts the number of times of the printing start signal (printing number) output from printing machine 106 after receiving the third count instruction. Printing number counter 22 stores printing number data 54 in which the lot number designated by the third count instruction is correlated with the printing number counted after the reception of the third count instruction in storage 40.

In the example of FIG. 11, printing number counter 22 stores printing number data 54 indicating that the printing number is 92 for the lot number "k" in storage 40.

Switching instruction unit 24 outputs the first switching instruction and the first count instruction in first timing (to be described later), outputs the second count instruction in second timing (to be described later), and outputs the second switching instruction and the third count instruction in third timing (to be described later).

Switching instruction unit 24 updates one of the mounting information information, the shaping status information, and the printing status information about lot management table 44 in the first timing to the third timing.

The first timing includes the following two timings. The first is timing at which both the following first and second conditions are satisfied. The first condition is a condition that the record including the mounting status information "in process" and the record including the mounting status information "unprocessed" exist in lot management table 44. The second condition is a condition that the mounting number and the planned number of products, corresponding to the lot number of the record including the mounting status information "in process", are matched with each other. The second is timing at which the record including the mounting status information "unprocessed" is newly added to lot management table 44 in the case where the record including the mounting status information "in process" does not exist in lot management table 44.

In the first timing, switching instruction unit 24 specifies the record including the mounting status information "in process" from lot management table 44 as a first target record, and specifies one record including the mounting status information "unprocessed" as a second target record. In the case where a plurality of records including the mounting status information "unprocessed" exist, switching instruction unit 24 specifies the record including the smallest lot number as the second target record among the plurality of records. In the case where the record including the mounting status information "in process" does not exist, switching instruction unit 24 does not specify the first target record.

Switching instruction unit 24 updates the mounting status information included in the first target record from "in process" to "completed".

Switching instruction unit 24 outputs the first switching instruction designating the mounting program number included in the second target record to mounting program selector 14, and outputs the first count instruction designating the lot number included in the second target record to mounting number counter 16. Switching instruction unit 24 updates the mounting status information included in the second target record from "unprocessed" to "in process".

The second timing includes the following two timings. The first is timing at which both the following third and fourth conditions are satisfied. The third condition is a condition that the record including shaping status information "in process" and the record including shaping status information "unprocessed" exist in lot management table 44. The fourth condition is a condition that the shaping number and the planned number of products, corresponding to the lot number of the record including the shaping status information "in process", are matched with each other. The second is timing at which the record including the shaping status information "unprocessed" is newly added to lot management table 44 in the case where the record including the shaping status information "in process" does not exist in lot management table 44.

In the second timing, switching instruction unit 24 specifies the record including the shaping status information "in process" from lot management table 44 as a third target record, and specifies one record including the shaping status information "unprocessed" as a fourth target record. In the case where a plurality of records including the shaping status information "unprocessed" exist, switching instruction unit 24 specifies the record including the smallest lot number as the fourth target record among the plurality of records. In the case where the record including the shaping status information "in process" does not exist, switching instruction unit 24 does not specify the third target record.

Switching instruction unit 24 updates the shaping status information included in the third target record from "in process" to "completed".

Switching instruction unit 24 outputs the second count instruction designating the lot number included in the fourth target record to shaping number counter 18. Switching instruction unit 24 updates the shaping status information included in the fourth target record from "unprocessed" to "in process".

The third timing includes the following two timings. The first is timing at which both the following fifth and sixth conditions are satisfied. The fifth condition is a condition that the record including printing status information "in process" and the record including printing status information "unprocessed" exist in lot management table 44. The sixth condition is a condition that a total value of the printing number corresponding to the lot number of the record including the printing status information "in process" and the defective product number corresponding to the lot number is matched with the planned number of products corresponding to the lot number. The second is timing at which the record including the printing status information "unprocessed" is newly added to lot management table 44 in the case where the record including the printing status information "in process" does not exist in lot management table 44.

In the third timing, switching instruction unit 24 specifies the record including the printing status information "in process" from lot management table 44 as a fifth target record, and specifies one record including the printing status information "unprocessed" as a sixth target record. In the case where a plurality of records including the printing status information "unprocessed" exist, switching instruction unit 24 specifies the record including the smallest lot number as the sixth target record among the plurality of records. In the case where the record including the printing status information "in process" does not exist, switching instruction unit 24 does not specify the fifth target record.

Switching instruction unit 24 updates the printing status information included in the fifth target record from "in process" to "completed".

Switching instruction unit 24 outputs the second switching instruction designating the printing program number included in the sixth target record to printing program selector 20, and outputs the third count instruction designating the lot number included in the sixth target record to printing number counter 22. Switching instruction unit 24 updates the printing status information included in the sixth target record from "unprocessed" to "in process".

(Processing of Switching Mounting Program in Control Device)

Figure 12:
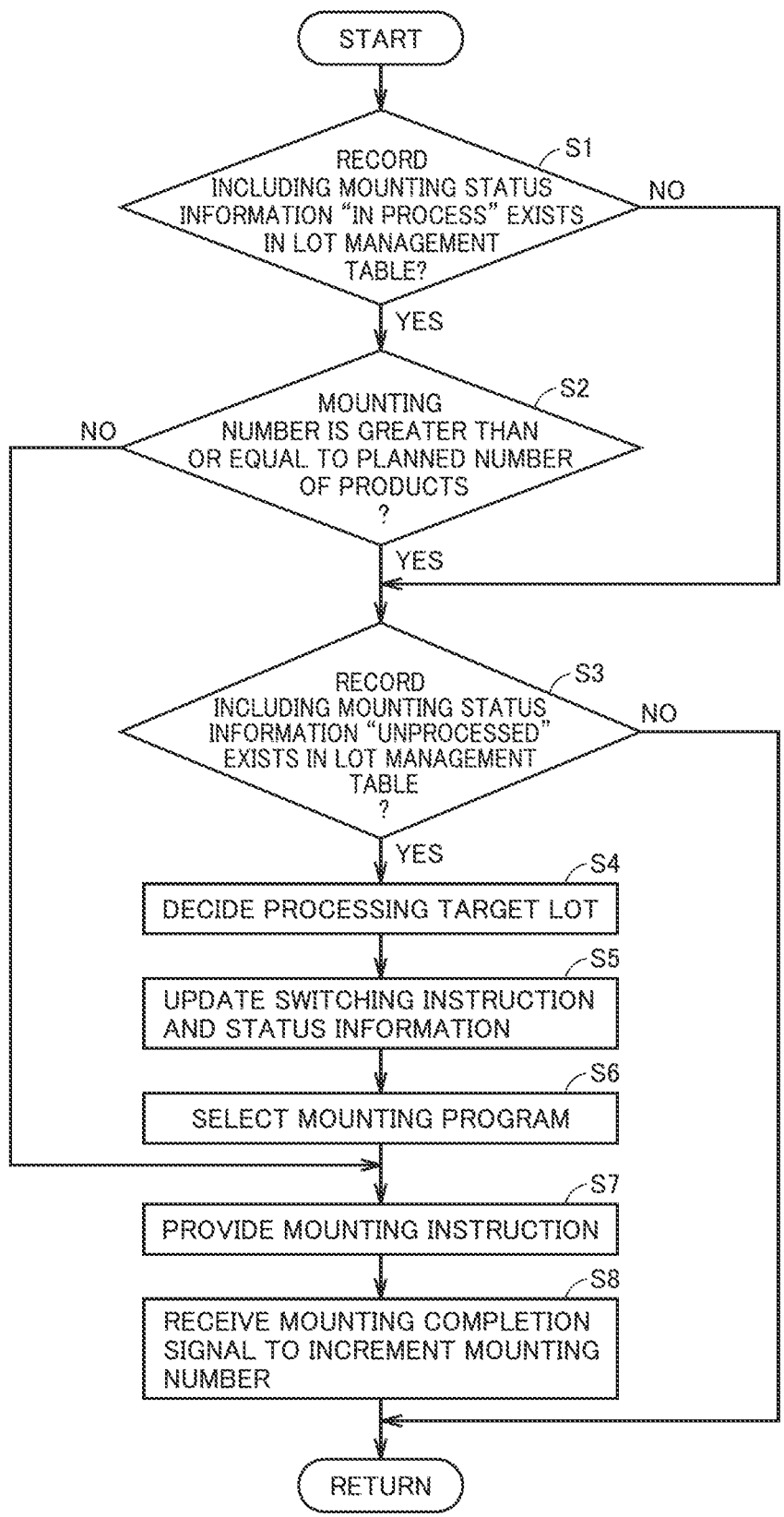
FIG. 12 is a flowchart illustrating a flow of processing of switching a mounting program.

With reference to FIG. 12, a flow of processing of switching the mounting program in control device 1 will be described below. FIG. 12 is a flowchart illustrating the flow of processing of switching the mounting program.

In step S1, switching instruction unit 24 determines whether the first target record including the mounting status information "in process" exists in lot management table 44.

When the first target record including the mounting status information "in process" exists in lot management table 44 (YES in S1), switching instruction unit 24 reads the mounting number corresponding to the lot number of the first target record from mounting number data 48, and reads the planned number of products from the first target record. Switching instruction unit 24 determines whether the read mounting number is greater than or equal to the planned number of products (step S2).

When the mounting number corresponding to the lot in process is greater than or equal to the planned number of products (YES in S2), switching instruction unit 24 determines whether the record including the mounting status information "unprocessed" exists in lot management table 44 (step S3). When the record including the mounting status information "in process" does not exist in lot management table 44 (NO in S1), the processing in step S3 is also performed.

When the record including the mounting status information "unprocessed" exists in lot management table 44 (YES in S3), switching instruction unit 24 decides one record including the mounting status information "unprocessed" as the second target record including the lot number that becomes the next processing target (step S4). When a plurality of records including the mounting status information "unprocessed" exist in step S4, switching instruction unit 24 decides the record including the smallest lot number as the second target record among the plurality of records.

In step S5, switching instruction unit 24 outputs the first switching instruction designating the mounting program number included in the second target record to mounting program selector 14, and outputs the first count instruction designating the lot number included in the second target record to mounting number counter 16. Switching instruction unit 24 updates the mounting status information in lot management table 44. Specifically, switching instruction unit 24 updates the mounting status information about the second target record to "in process", and updates the mounting status information about the first target record to "completed" in the case where the first target record of the mounting status information "in process" exists in lot management table 44.

In step S6, mounting program selector 14 selects the mounting program corresponding to the mounting program number designated by the first switching instruction from mounting program group 46.

After step S6, in step S7, mounting program selector 14 outputs, to mounter 102, the mounting instruction to which the selected mounting program is added. When the mounting number corresponding to the lot in process is not greater than or equal to the planned number of products (NO in S2), the processing in step S7 is performed, and the mounting instruction to which the same mounting program as the previous one is added is output to mounter 102.

In step S8, mounting number counter 16 receives the mounting completion signal from mounter 102, and increments the mounting number corresponding to the lot number designated by the first count instruction by one.

After step S8, the processing is returned to step S1. When the record including the mounting status information "unprocessed" does not exist in lot management table 44 (NO in S3), the processing is returned to step S1.

(Processing of Switching Printing Program in Control Device)

Figure 13:
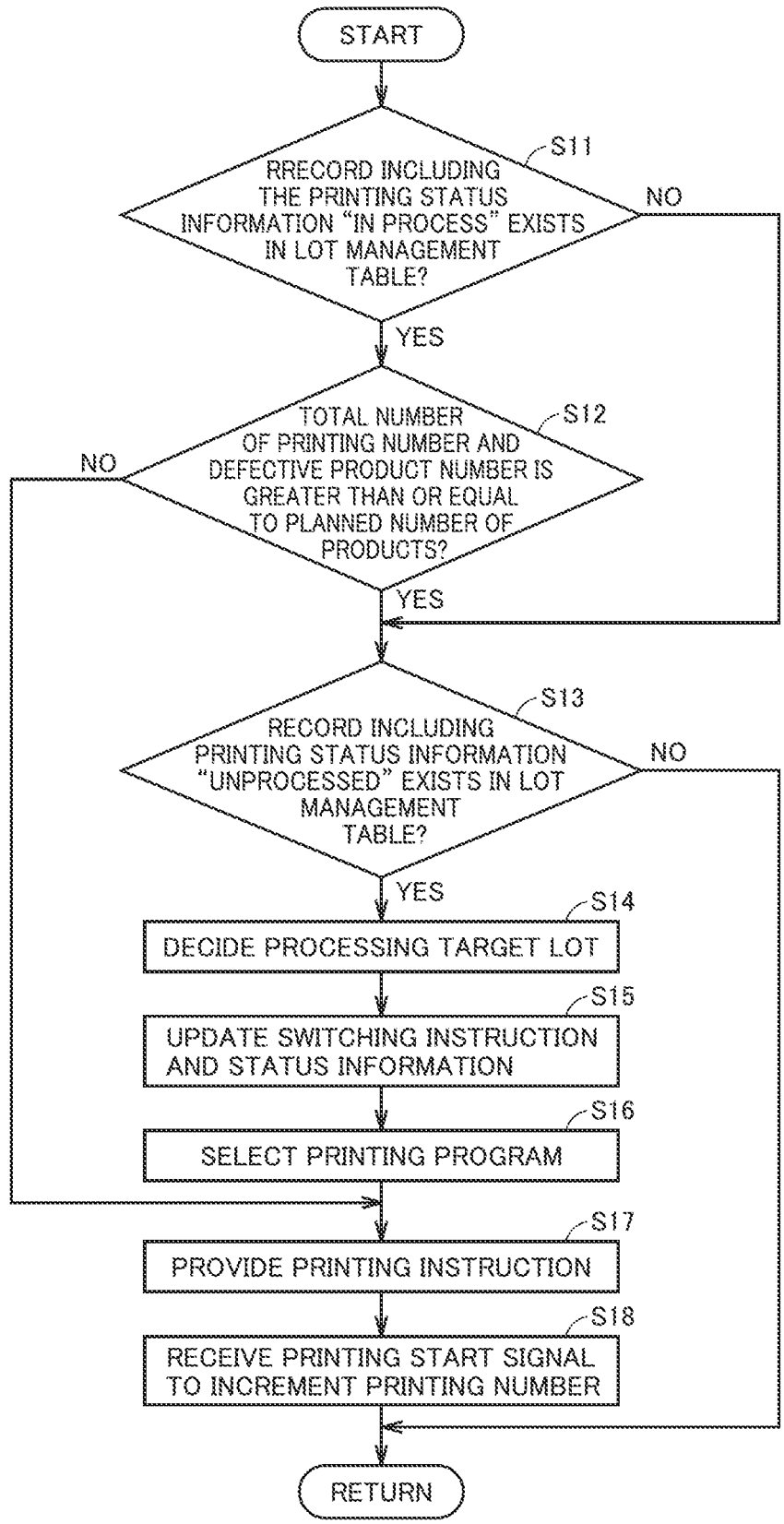
FIG. 13 is a flowchart illustrating a flow of processing of switching a printing program.

With reference to FIG. 13, a flow of processing of switching the printing program in control device 1 will be described below. FIG. 13 is a flowchart illustrating the flow of processing of switching the printing program.

In step S11, switching instruction unit 24 determines whether the fifth target record including the printing status information "in process" exists in lot management table 44.

When the fifth target record exists in lot management table 44 (YES in S11), switching instruction unit 24 reads the printing number and the defective product number, corresponding to the lot number of the fifth target record, from printing number data 54 and shaping number data 50, respectively. Switching instruction unit 24 reads the planned number of product from the fifth target record. Switching instruction unit 24 determines whether the total number of the read printing number and defective product number is greater than or equal to the planned number of products (step S12).

When the total number of the printing number and the defective product number, corresponding to the lot in process, is greater than or equal to the planned number of products (YES in S12), switching instruction unit 24 determines whether the record including the printing status information "unprocessed" exists in lot management table 44 (step S13). When the fifth target record including the printing status information "in process" does not exist in lot management table 44 (NO in S11), the processing in step S13 is also performed.

When the record including the printing status information "unprocessed" exists in lot management table 44 (YES in S13), switching instruction unit 24 decides one record including the printing status information "unprocessed" as the sixth target record including the lot number that becomes the next processing target (step S14). When a plurality of records including the printing status information "unprocessed" exist in step S14, switching instruction unit 24 decides the record including the smallest lot number as the sixth target record among the plurality of records.

In step S15, switching instruction unit 24 outputs the second switching instruction designating the printing program number included in the sixth target record to printing program selector 20, and outputs the third count instruction designating the lot number included in the sixth target record to printing number counter 22. Switching instruction unit 24 updates the printing status information in lot management table 44. Specifically, switching instruction unit 24 updates the printing status information about the sixth target record to "in process", and updates the printing status information about the fifth target record to "completed" in the case where the fifth target record of the printing status information "in process" exists in lot management table 44.

In step S16, printing program selector 20 selects the printing program corresponding to the printing program number designated by the second switching instruction from printing program group 52.

After step S16, in step S17, printing program selector 20 outputs, to printing machine 106, the printing instruction to which the selected printing program is added. When the total number of the printing number and the defective product number, corresponding to the lot in process, is not greater than or equal to the planned number of product (NO in S12), the processing in step S17 is performed, and the printing instruction to which the same printing program as the previous one is added is output to printing machine 106.

In step S18, printing number counter 22 receives the printing start signal from printing machine 106, and increments the printing number corresponding to the lot number designated by the third count instruction by one.

After step S18, the processing is returned to step S11. When the record including the printing status information "unprocessed" does not exist in lot management table 44 (NO in S13), the processing is returned to step S11.

(Hardware Configuration of Control Device)

Figure 14:
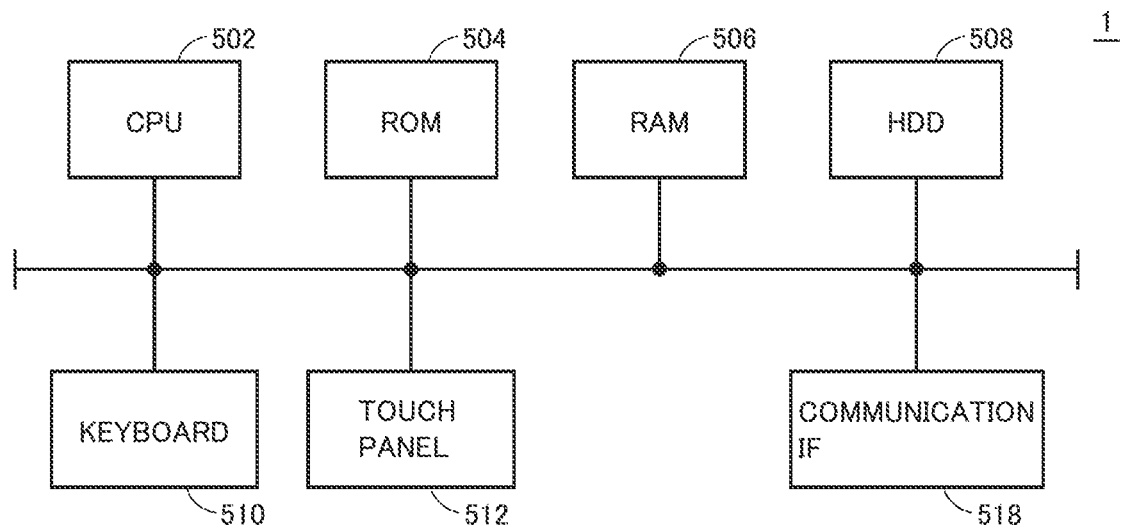
FIG. 14 is a schematic view illustrating an example of a hardware configuration of the control device.

FIG. 14 is a schematic view illustrating an example of a hardware configuration of control device 1. Referring to FIG. 14, control device 1 includes a CPU 502 that executes various programs including OS, ROM (Read Only Memory) 504 that stores BIOS and various types of data, a RAM 506 that provides a work area for storing data necessary for the execution of the program by CPU 502, and a hard disk (HDD) 508 that non-volatilely stores the program executed by CPU 502. CPU 502 executes the program stored in HDD 508 to implement specification setting unit 12, mounting program selector 14, mounting number counter 16, shaping number counter 18, printing program selector 20, printing number counter 22, and switching instruction unit 24 described above. Storage 40 is configured by ROM 504 and RAM 506.

Control device 1 further includes a keyboard 510 that receives an operation from a user, a touch panel 512, and a communication interface (IF) 518 that communicates with manufacturing line 100 and the like. Operation unit 10 is configured by keyboard 510 and touch panel 512. Control device 1 is communicably connected to manufacturing line 100 by communication IF 518.

(Advantage)

As described above, control device 1 includes specification setting unit 12 that sets the specification and the planned number of products of electronic device (product) 200 to be manufactured through manufacturing line 100, mounting program selector 14 that selects the mounting program to be used by mounter 102 from the plurality of mounting programs indicating the types and positions of electronic components 210, and mounting number counter (first counter) 16 that counts the mounting number from mounter 102 using the mounting program, for each of the selected mounting programs. Control device 1 includes shaping number counter (second counter) 18 that counts the defective product number of shaped resin body 220, in which electronic component 210 disposed using the mounting program is embedded, for each mounting program. Control device 1 includes printing program selector 20 that selects the printing program to be used by printing machine 106 from the plurality of printing programs indicating the wiring patterns and printing number counter (third counter) 22 that counts the printing number from printing machine 106 using the printing program, for each of the selected printing programs.

When specification setting unit 12 sets the specification of the lot number "k" in FIG. 6, and then sets the specification of the lot number "k+1", the following processing is performed. That is, mounting program selector 14 selects the mounting program (first mounting program) of a mounting program number "mp0001" corresponding to the lot number "k". Subsequently, according to the matching between the mounting number of the mounting program and the planned number of products of the lot number "k", mounting program selector 14 selects the mounting program (second mounting program) having a mounting program number "mp0250" corresponding to the lot number "k+1".

Printing program selector 20 selects the printing program (first printing program) of a printing program number "pp0001" corresponding to the lot number "k". Subsequently, according to the matching between (i) the sum of the printing number of the printing program and the defective product number of shaped resin body 220 in which electronic component 210 mounted by the mounting program having the mounting program number "mp0001" is embedded and (ii) the planned number of products of the lot number "k", printing program selector 20 selects the printing program (second printing program) having a printing program number "pp0300" corresponding to the lot number "k+1".

Electronic component 210 is mounted by the mounting program corresponding to the lot number "k", and wiring 230 is formed by the printing program corresponding to the lot number "k", and then electronic component 210 is mounted by the mounting program corresponding to the next lot number "k+1", and wiring 230 is formed by the printing program corresponding to the lot number "k+1". Consequently, electronic device 200 can easily be customized by switching the mounting program and the printing program according to the specification.

In response to the completion of the mounting of electronic component 210 of the previous lot, mounter 102 performs the mounting according to the mounting program corresponding to the next lot. Similarly, in response to the completion of the printing of the wiring on shaped resin body 220 of the previous lot, the printing is performed by printing machine 106 according to the printing program of the wiring pattern corresponding to the next lot. In this way, the mounting program and the printing program are switched at appropriate timing.

In control device 1, the following effects can be obtained.

(1) The on-demand production of electronic device 200 including shaped resin body 220 in which electronic component 210 is embedded and wiring 230 can easily be performed. That is, the demand for small lot production of many products can flexibly be coped with by a simple method.

(2) The mismatch between the mounting position of electronic component 210 and the pattern of wiring 230 can be prevented even if workpiece stagnation or the like is generated in the shaping step that is an intermediate step with injection molding machine 104.

(3) The mismatch between the mounting position of electronic component 210 and the pattern of wiring 230 can be prevented even if the number of taken pieces of shaped resin bodies 220 changes due to the generation of the shaping defect or the like in the shaping step that is the intermediate step with injection molding machine 104.

(Supplementary Note)

Operation unit 10 may receive customization information, in which the types and positions of electronic components 210 are identical to those of the standard specification and only the shape of wiring 230 is different. In this case, in specification table 42, the mounting program number corresponding to the customization information is set identical to the mounting program number of the standard specification, and the printing program number corresponding to the customization information is different from the printing program number of the standard specification. Consequently, electronic device 200 in which only the shape of wiring 230 differs from that of the standard specification can be manufactured.

Second Embodiment

Depending on the electronic instrument, an illegal action for electronic device 200 mounted on the electronic instrument becomes problematic. Examples of the illegal actions include an action of causing a sensor included in electronic device 200 to malfunction to illegally change an output value of the sensor and an action of electrically connecting another previously-prepared electronic component to electronic device 200 to cause the electronic instrument to perform an operation different from an original operation.

The illegal action is performed on the assumption that the positions of electronic component 210 such as a sensor and wiring 230 in electronic device 200 are kept constant. In the case where the position of the sensor varies depending on electronic device 200, the sensor is hardly caused to malfunction because the position of the sensor in the electronic instrument cannot accurately be specified. In the case where the position of wiring 230 varies depending on electronic device 200, the previously-prepared electronic component is hardly electrically connected to the desired position of electronic device 200.

A control device according to a second embodiment prevents the illegal action, and the control device of the second embodiment differs from control device 1 of the first embodiment in that manufacturing line 100 can be controlled such that the positions of electronic component 210 and wiring 230 vary depending on electronic device 200 even with the same specification.

Figure 15A:
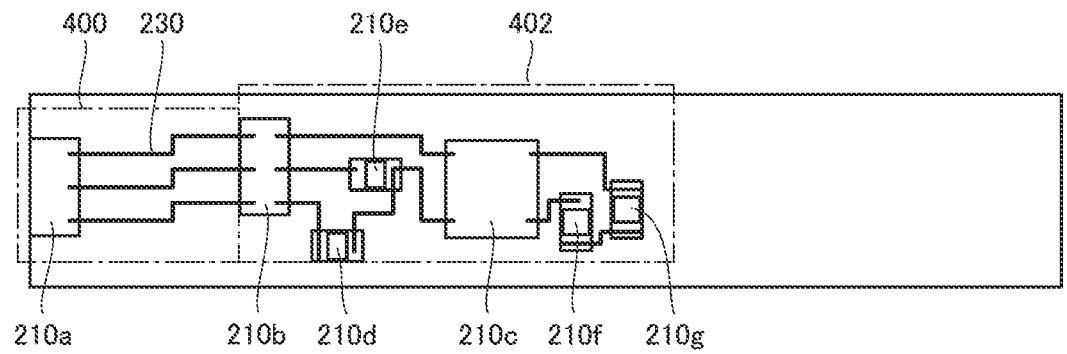
FIG. 15A is a plan view illustrating an example of an electronic device manufactured by a manufacturing line according to a second embodiment.
Figure 15B:
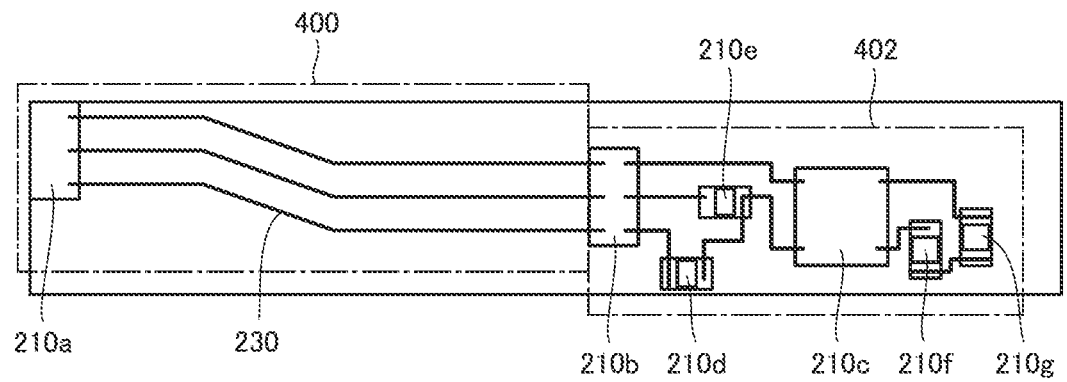
FIG. 15B is a plan view illustrating another example of the electronic device manufactured by the manufacturing line of the second embodiment.

FIG. 15A is a plan view illustrating an example of the electronic device manufactured by the manufacturing line of the second embodiment. FIG. 15B is a plan view illustrating another example of the electronic device manufactured by the manufacturing line of the second embodiment. FIGS. 15A and 15B illustrate two types of electronic devices 200 that correspond to a certain specification. Electronic device 200 in FIG. 15A and electronic device 200 in FIG. 15B have the same circuits although electronic device 200 in FIG. 15A and electronic device 200 in FIG. 15B differ from each other in the positions of electronic components 210a to 210g and wiring 230. When the specification of the circuit is set, the control device of the second embodiment arbitrarily decides whether electronic device 200 in FIG. 15A or electronic device 200 in FIG. 15B is manufactured.

(Configuration of Control Device)

Figure 16:
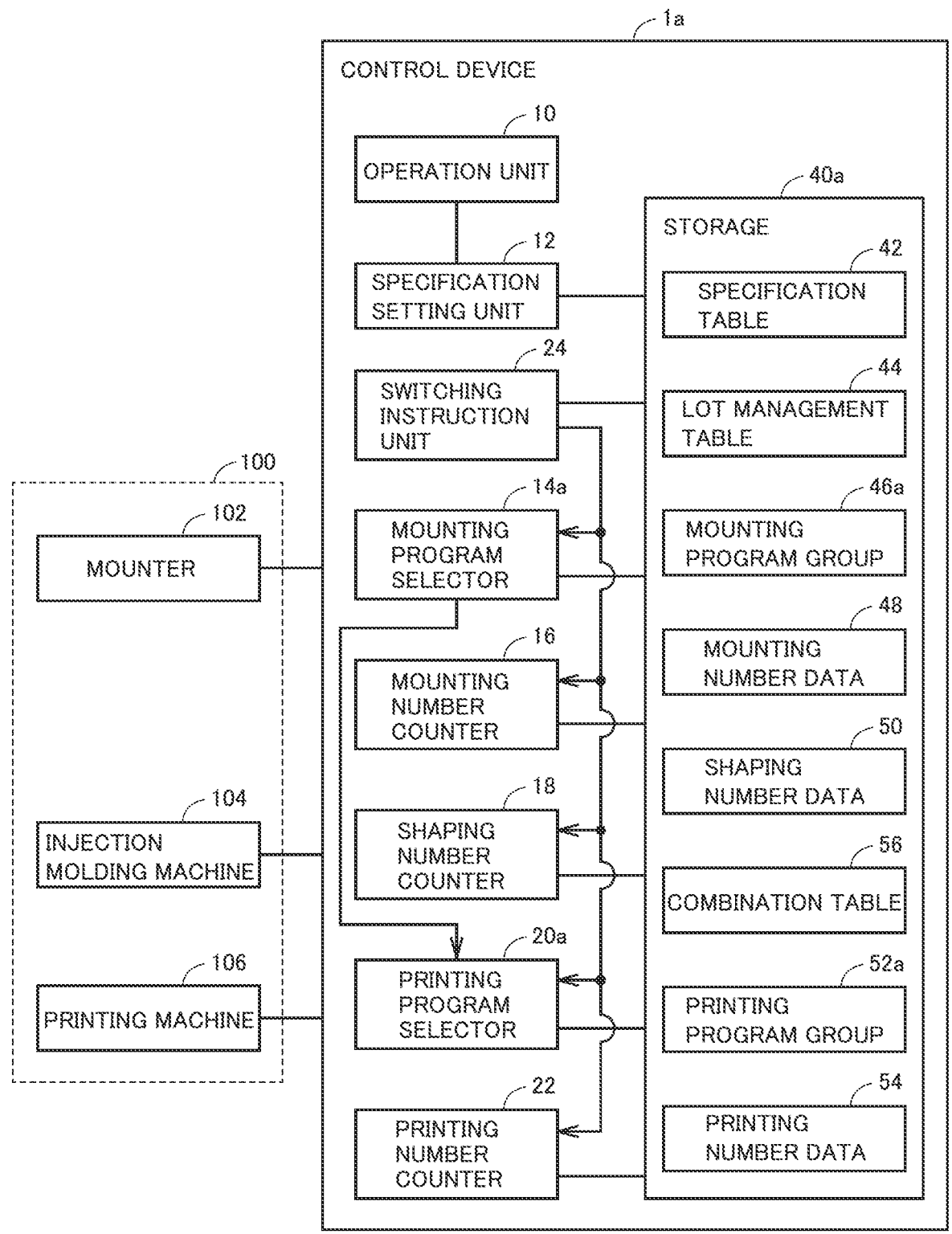
FIG. 16 is a block diagram illustrating a schematic configuration of a control device of the second embodiment.

With reference to FIGS. 16 to 18, a configuration of a control device 1a of the second embodiment will be described. FIG. 16 is a block diagram illustrating a schematic configuration of control device 1a. FIG. 17 is a view illustrating an example of a mounting program group 46a stored in a storage 40a of control device 1a. FIG. 18 is a view illustrating an example of a combination table 56 stored in storage 40a.

As illustrated in FIG. 16, control device 1a differs from control device 1 (see FIG. 4) of the first embodiment in that control device 1a includes a mounting program selector 14a, a printing program selector 20a, and a storage 40a instead of mounting program selector 14, printing program selector 20, and storage unit 40. Storage 40a differs from storage 40 (see FIG. 4) of the first embodiment in that mounting program group 46a and a printing program group 52a are stored in storage 40a instead of mounting program group 46 and printing program group 52 and that a combination table 56 is stored in storage 40a.

Mounting program group 46a includes at least two mounting programs for one mounting program number. In the case where mounting program group 46a includes at least two mounting programs for one mounting program number, each of the at least two mounting programs is identified by a mounting program sub-number. In the example of FIG. 17, mounting program group 46a includes the mounting programs having a mounting program sub-number "mp0001(1)" and a mounting program sub-number "mp0001(2)" for the mounting program number "mp0001" (see FIG. 5) included in specification table 42.

Mounting program group 46a may include at least two mounting programs for each of all mounting program numbers included in specification table 42, or include at least two mounting programs for each of some of mounting program numbers included in specification table 42. Mounting program group 46a may include three or more mounting programs for one mounting program number.

Printing program group 52a includes at least two printing programs for one printing program number. In the case where printing program group 52a includes at least two printing programs for one printing program number, each of the at least two printing programs is identified by a printing program sub-number.

Printing program group 52a may include at least two printing programs for each of all the printing program numbers included in specification table 42, or include at least two printing programs for each of some of the printing program numbers included in specification table 42. Printing program group 52a may include three or more printing programs for one printing program number.

In the case where at least two mounting programs exist for a certain mounting program number, the at least two mounting programs differ from each other in the disposition of electronic components 210. When the disposition of electronic component 210 varies, it is necessary to vary the pattern of wirings 230 connected to electronic component 210. For this reason, the printing program suitable for the mounting program is previously designed for each mounting program identified by the mounting program sub-number.

Combination table 56 is a table in which the mounting program sub-number is correlated with the printing program sub-number identifying the printing program suitable for the mounting program identified by the mounting program sub-number. In combination table 56 of the example in FIG. 18, the mounting program sub number "mp0001(1)" and a printing program sub number "pp0001(1)" are correlated with each other.

In the case where at least two mounting programs are designed for electronic device 200 including many electronic components 210, many electronic components 210 may be divided into a plurality of groups, and each mounting program may be designed such that the dispositions of the plurality of groups in the at least two mounting programs differ from each other. Consequently, at least two mounting programs in which the dispositions of electronic components 210 differ from each other and a printing program corresponding to each mounting program can easily be designed. Electronic device 200 in FIG. 15A differs from electronic device 200 in FIG. 15B in the positions of a group 400 including electronic component 210a and a group 402 including electronic components 210b to 210g.

Mounting program selector 14a receives the first switching instruction from switching instruction unit 24, and performs the processing similar to that of the first embodiment in the case where only one mounting program corresponding to the mounting program number designated by the first switching instruction is included in mounting program group 46a.

On the other hand, in the case where at least two mounting programs corresponding to the designated mounting program number are included in mounting program group 46a, mounting program selector 14a arbitrarily selects one mounting program from the at least two mounting programs. At this point, mounting program selector 14a preferably selects the mounting program different from the mounting program selected last time. Mounting program selector 14a outputs the mounting program sub-number identifying the selected mounting program to printing program selector 20a.

Printing program selector 20a receives the second switching instruction from switching instruction unit 24, and performs the processing similar to that of the first embodiment in the case where only one printing program corresponding to the printing program number designated by the second switching instruction is included in printing program group 52a.

On the other hand, in the case where at least two printing programs corresponding to the designated printing program number are included in printing program group 52a, printing program selector 20a selects one printing program from the at least two printing programs. At this point, printing program selector 20a reads the printing program sub-number corresponding to the latest mounting program sub-number received from mounting program selector 14a from combination table 56, and selects the printing program having the read printing program sub-number from printing program group 52a.

In the second embodiment, even if the customization information indicating the identical specification is input to operation unit 10, electronic device 200 having different disposition of electronic component 210 is manufactured each time the input is performed. That is, the embedded position of electronic component 210 in electronic device 200 can variously be changed. Consequently, the illegal action to electronic device 200 can be prevented.

(First Modification)

In the above description, electronic device 200 in which the dispositions of both electronic component 210 and wiring 230 differ can be manufactured even if the identical specification is set. However, in the case where the identical specification is set, control device 1a may control manufacturing line 100 such that electronic device 200 in which only the pattern of wiring 230 differs can be manufactured.

That is, specification table 42 in FIG. 5 includes at least one record having the mounting program number corresponding only to one mounting program in mounting program group 46a and the printing program numbers corresponding to at least two printing programs in printing program group 52a.

Mounting program selector 14a outputs a mounting program sub-number "none" to the printing program selector 20a in the case where only one mounting program corresponding to the designated mounting program number is included in mounting program group 46a.

Printing program selector 20a may arbitrarily select one printing program from at least two printing programs corresponding to the designated printing program number in the case where the latest mounting program sub-number received from mounting program selector 14a is "none".

(Second Modification)

In the above description, in the case where a certain specification and the planned number of products of the specification are set, electronic devices 200 are manufactured by the planned number of products according to one mounting program arbitrarily selected from at least two mounting programs corresponding to the specification and the printing program corresponding to the mounting program.

However, in the case where a certain specification and the planned number of products of the specification are set, control device 1a may control manufacturing line 100 such that electronic devices 200 of the planned number of products are manufactured in total according to each of at least two mounting programs for the specification and the printing program corresponding to the mounting program.

Specification setting unit 12 adds a plurality of records to lot management table 44 in the case where the program information including the mounting program number corresponding to at least two mounting programs is read from specification table 42 according to the customization information received by operation unit 10. Specifically, specification setting unit 12 adds the record based on the read program information to lot management table 44 by the number of mounting programs corresponding to the mounting program numbers. At this point, specification setting unit 12 adds a sub-number to the lot number of each added record.

Specification setting unit 12 sets the planned number of products of each of the plurality of records such that the total value of the planned numbers of products of the plurality of added records is matched with the planned number of products input to operation unit 10. At this point, specification setting unit 12 may arbitrarily set the planned number of products of each of the plurality of records, or set the planned number of products of each of the plurality of records such that the planned numbers of products of the plurality of records become equal to each other.

FIG. 19 is a view illustrating an example of lot management table 44 in the second modification. FIG. 19 illustrates the example, in which the customization information corresponding to the mounting program number "mp0001" and the planned number of products "100" are input to operation unit 10 and the record including the mounting program number "mp0001" is added to lot management table 44. Specification setting unit 12 adds two records including the mounting program number "mp0001" to lot management table 44 because two mounting programs corresponding to the mounting program number "mp0001" exist. At this point, specification setting unit 12 sets the lot numbers of the two records to "k", adds a sub-number "1" (represented by the numbers in parentheses in FIG. 19) to the lot number of one of the records, and adds a sub-number "2" to the lot number of the other record. Specification setting unit 12 sets the planned number of products of each record to "50" that is a half of the planned number of products "100" received by operation unit 10.

Similarly to the first embodiment, switching instruction unit 24 outputs the first switching instruction, the second switching instruction, and the first to third count instructions at appropriate timings according to lot management table 44. In the case where the plurality of records of the lot numbers to which the sub-numbers are added exist, switching instruction unit 24 selects the records of processing targets according to the order of the sub-number.

Thus, for example, mounting program selector 14a selects the mounting program (third mounting program) having a mounting program sub-number "mp0001(1)" for a lot number "k(1)". Subsequently, according to the matching between the mounting number of the mounting program and the planned number of products "50" corresponding to the lot number "k(1)", mounting program selector 14a selects the mounting program (fourth mounting program) having a mounting program sub-number "mp0001(2)" for a lot number "k(2)".

Thus, mounter 102 manufactures 50 temporary fixing sheets on which electronic components 210 are mounted according to the mounting program having the mounting program sub-number "mp0001(1)", and manufactures 50 temporary fixing sheets on which electronic components 210 are mounted according to the mounting program having the mounting program sub-number "mp0001(2)".

Printing program selector 20a selects the printing program (third printing program) having the printing program sub-number corresponding to the printing program sub-number "pp0001(1)". Subsequently, according to the matching between the total number of the printing number of the printing program and the defective product number and the planned number of products "50" corresponding to the lot number "k(1)", printing program selector 20a selects the printing program (fourth printing program) having the printing program sub-number corresponding to a printing program sub-number "pp0001(2)" for the lot number "k(2)".

In this way, electronic devices 200 having different dispositions of electronic components 210 and wirings 230 are manufactured with the identical specification. As a result, it becomes difficult to correctly specify the positions of electronic component 210 and wiring 230, and the illegal action can be prevented.

(Third Modification)

A cover layer of the same color as shaped resin body 220 may be applied to the surface of electronic device 200. Consequently, it becomes difficult to correctly specify the position of electronic component 210, and the illegal action can further be prevented.

Third Embodiment

In the above embodiments, injection molding machine 104 performs injection molding using the identical molding die and the identical resin material regardless of the lot number. For this reason, the outer shape and the color of shaped resin body 220 becomes identical regardless of the lot number. In other words, the shape and the color of shaped resin body 220 cannot be customized.

Shaped resin body 220 may be used as a part of a housing of the electronic instrument on which electronic device 200 is mounted. In this case, preferably, the shape and the color of shaped resin body 220 can also be customized. A control device according to a third embodiment controls the manufacturing line such that the shape and the color of shaped resin body 220 can also be customized.

Figure 20:
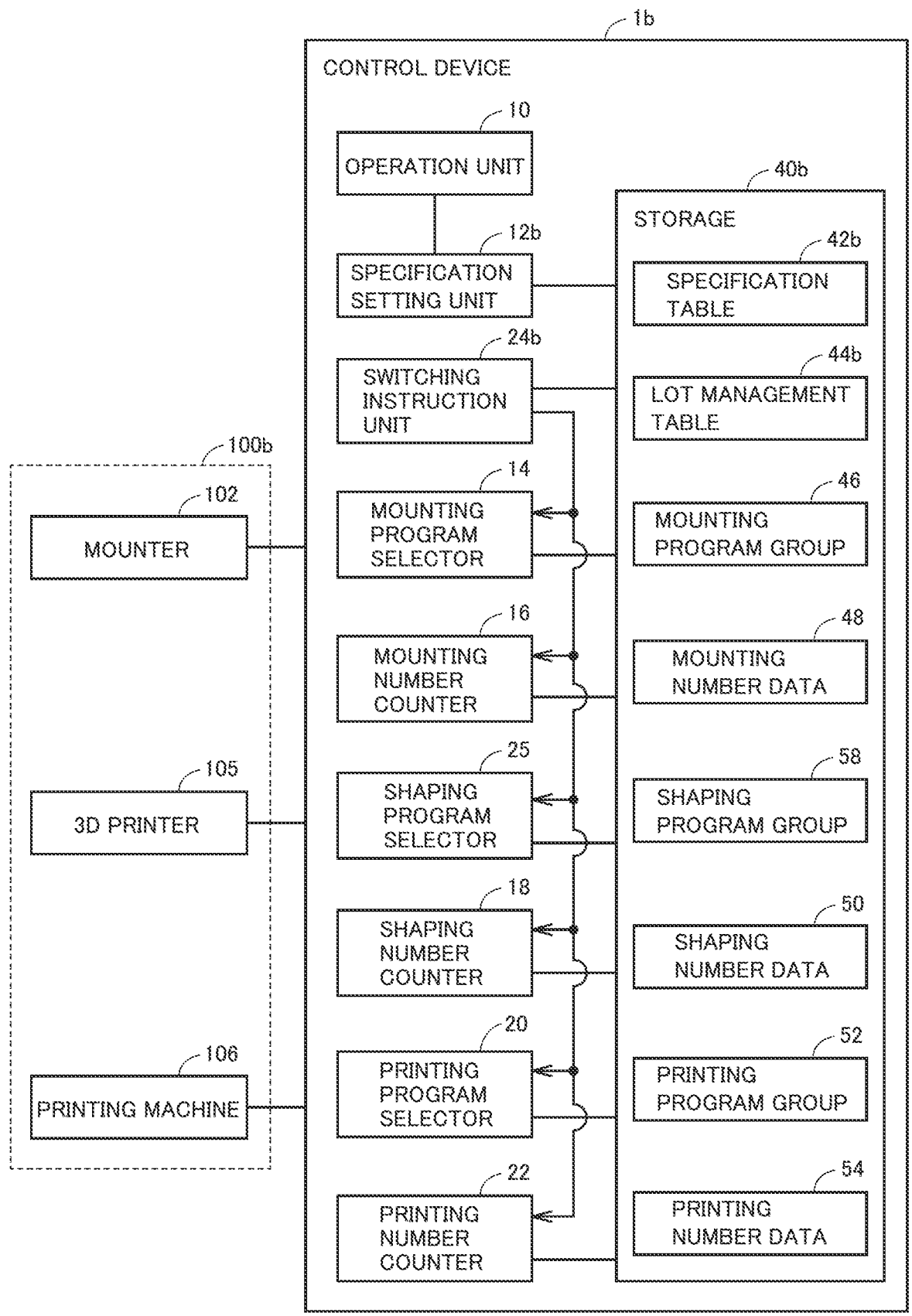
FIG. 20 is a block diagram illustrating a manufacturing line and a control device according to a third embodiment.

FIG. 20 is a block diagram illustrating a manufacturing line 100b and a control device 1b of the third embodiment.

As illustrated in FIG. 20, manufacturing line 100b is different from manufacturing line 100 of the first embodiment in that a 3D printer 105 is provided instead of injection molding machine 104. 3D printer 105 is a shaping device (modeling device) that shapes into shaped resin body 220 by applying a lamination modeling method. Examples of the lamination modeling method include a hot melt laminating method and an optical modeling method.

3D printer 105 receives a shaping instruction to which the shaping program is added from the outside. The shaping program designates the type (such as the color and the material) of the resin material and the shape of shaped resin body 220. When receiving the next shaping instruction during the shaping processing, 3D printer 105 temporarily stores the next shaping instruction in the buffer, and starts the shaping processing according to the next shaping instruction after the completion of the currently-performed shaping.

3D printer 105 uses the designated type of resin material to shape into shaped resin body 220 having the designated shape on temporary fixing sheet 300 on which electronic component 210 is mounted by mounter 102. For this reason, the material, the color, and the shape of shaped resin body 220 from 3D printer 105 can easily be customized by switching the shaping program.

Similarly to injection molding machine 104 of the first embodiment, 3D printer 105 inspects the external appearance of shaped resin body 220 that has been shaped, and determines the quality of shaped resin body 220. For example, when shaped resin body 220 is a non-defective product, 3D printer 105 conveys shaped resin body 220 to printing machine 106 while placing shaped resin body 220 on the conveyance belt, and outputs the shaping completion signal. When shaped resin body 220 is a defective product, 3D printer 105 discards shaped resin body 220 as a defective product, and outputs the shaping completion signal to which the defective shaping signal indicating the defective product is added.

Control device 1b differs from control device 1 of the first embodiment in that control device 1b includes a specification setting unit 12b, a switching instruction unit 24b, and a storage 40b instead of specification setting unit 12, switching instruction unit 24, and storage 40, and that control device 1b further includes a shaping program selector 25. Storage 40b is different from storage 40 of the first embodiment in that storage 40b stores a specification table 42b and a lot management table 44b instead of specification table 42 and lot management table 44, and that storage 40b further stores a shaping program group 58.

FIG. 21 is a view illustrating an example of specification table 42b. As illustrated in FIG. 21, specification table 42b differs from specification table 42 in FIG. 5 in that specification table 42b includes information indicating the shape and the color of shaped resin body 220 in the customization information and a shaping program number in the program information. In the third embodiment, operation unit 10 can receive information customizing the shape and the color of shaped resin body 220 as one of the pieces of customization information.

Similarly to the first embodiment, specification setting unit 12b reads the program information corresponding to the customization information received by operation unit 10 from specification table 42b, and adds a new record to lot management table 44b according to the read program information.

FIG. 22 is a view illustrating an example of lot management table 44b. Lot management table 44b includes the record in which the lot number, the mounting program number, the shaping program number, the printing program number, the planned number of products, the mounting status information, the shaping status information, and the printing status information are correlated with one another.

Specification setting unit 12b sets the lot number according to order in which operation unit 10 receives the customization information and the planned number of products, and produces the record in which the lot number, the program information (the mounting program number, the shaping program number, and the printing program number) corresponding to the customization information, and the planned number of products are correlated with one another.

The shaping status information is information indicating the status of shaping processing of 3D printer 105, and indicates one of "unprocessed", "in process", and "completed". When adding the new record to lot management table 44, specification setting unit 12 sets the mounting status information, the shaping status information, and the printing status information of the record to "unprocessed".

Shaping program group 58 includes the shaping program corresponding to each shaping program number. The shaping program is a program that causes 3D printer 105 to operate, and indicates the type of resin material to be used and the shape of shaped resin body 220.

Shaping program selector 25 receives the third switching instruction designating the shaping program number from switching instruction unit 24b, and selects the shaping program of 3D printer 105 according to the third switching instruction. Specifically, shaping program selector 25 selects the shaping program corresponding to the shaping program number designated by the third switching instruction from shaping program group 58. Shaping program selector 25 outputs, to 3D printer 105, a shaping instruction to which the selected shaping program is added.

Switching instruction unit 24b differs from switching instruction unit 24 of the first embodiment only in that switching instruction unit 24b outputs the third switching instruction together with the second count instruction at the above second timing. Switching instruction unit 24b outputs the third switching instruction designating the shaping program number included in the record of the shaping status information "unprocessed" specified as the fourth target record to the shaping program selector 25.

(Processing of Switching Shaping Program in Control Device)

Figure 23:
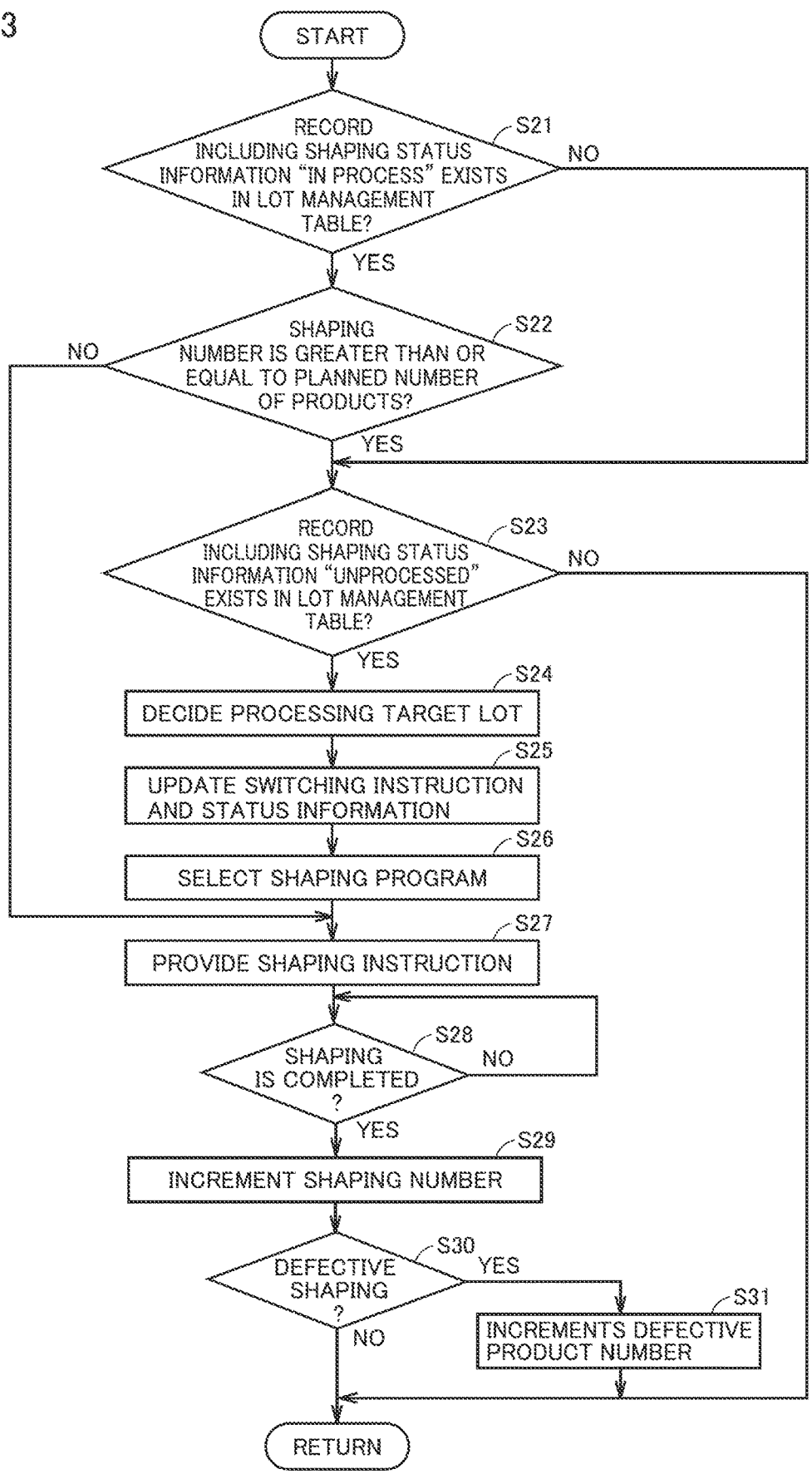
FIG. 23 is a flowchart illustrating a flow of processing of switching a shaping program.

With reference to FIG. 23, a flow of processing of switching the shaping program in control device 1b will be described below. FIG. 23 is a flowchart illustrating the flow of processing of switching the shaping program.

In step S21, switching instruction unit 24b determines whether the record including the shaping status information "in process" exists in lot management table 44b.

When the third target record including the mounting status information "in process" exists in lot management table 44b (YES in S21), switching instruction unit 24b reads the shaping number corresponding to the lot number of the third target record from shaping number data 50, and reads the planned number of products from the third target record. Switching instruction unit 24b determines whether the read shaping number is greater than or equal to the planned number of products (step S22).

When the shaping number corresponding to the lot in process is greater than or equal to the planned number of products (YES in S22), switching instruction unit 24b determines whether the record including the shaping status information "unprocessed" exists in lot management table 44b (step S23). When the record including the shaping status information "in process" does not exist in lot management table 44b (NO in S21), the processing in step S23 is also performed.

When the record including the shaping status information "unprocessed" exists in lot management table 44b (YES in S23), switching instruction unit 24b decides one record including the shaping status information "unprocessed" as the fourth target record including the lot number that becomes the next processing target (step S24). When the plurality of records including the shaping status information "unprocessed" exist in step S24, switching instruction unit 24b decides the record including the smallest lot number as the fourth target record among the plurality of records.

In step S25, switching instruction unit 24b outputs the third switching instruction designating the shaping program number included in the fourth target record to shaping program selector 25, and outputs the second count instruction designating the lot number included in the fourth target record to shaping number counter 18. Switching instruction unit 24b updates the shaping status information in lot management table 44b. Specifically, switching instruction unit 24b updates the shaping status information about the fourth target record to "in process", and updates the shaping status information about the third target record to "completed" in the case where the third target record of the shaping status information "in process" exists in lot management table 44b.

In step S26, shaping program selector 25 selects the shaping program corresponding to the shaping program number designated by the third switching instruction from shaping program group 58.

After step S26, in step S27, shaping program selector 25 outputs, to 3D printer 105, the shaping instruction to which the selected shaping program is added. When the shaping number corresponding to the lot in process is not greater than or equal to the planned number of products (NO in S22), the processing in step S27 is performed, and the shaping instruction to which the same shaping program as the previous one is added is output to 3D printer 105.

In step S28, shaping number counter 18 checks whether the shaping completion signal is received from 3D printer 105. When the shaping completion signal is not received (NO in S28), the processing is returned to step S28 again.

When the shaping completion signal is received (YES in S28), shaping number counter 18 increments the shaping number corresponding to the lot number designated by the second count instruction by one (step S29).

In step S30, shaping number counter 18 determines whether the defective shaping signal is added to the shaping completion signal. When the defective shaping signal is added (YES in S30), shaping number counter 18 increments the defective product number corresponding to the lot number designated by the second count instruction by one (step S31).

After step S31, the processing is returned to step S1. When the record including the shaping status information "unprocessed" does not exist in lot management table 44b (NO in S23), and when the defective shaping signal is not added (YES in S30), the processing is returned to step S1.

(Advantage)

As described above, control device 1b includes shaping program selector 25 that selects a shaping program to be used by 3D printer 105 from the plurality of shaping programs indicating the shape and the material of shaped resin body 220 and shaping number counter (fourth counter) 18 that counts the shaping number from 3D printer 105 using the shaping program, for each of the selected shaping programs.

When specification setting unit 12 sets the specification of the lot number "k" in FIG. 6, and then sets the specification of the lot number "k+1", the following processing is performed. That is, shaping program selector 25 selects the shaping program (first shaping program) having a shaping program number "fp0001" corresponding to the lot number "k". Subsequently, according to the matching between the shaping number corresponding to the shaping program and the planned number of products of the lot number "k", shaping program selector 25 selects the shaping program (second shaping program) having a shaping program number "fp0300" corresponding to the lot number "k+1".

Consequently, the shape and the color of shaped resin body 220 can easily be customized by switching the shaping program according to the specification.

In the above description, control device 1b customizes both the resin material (the color and the type) and the shape of shaped resin body 220. Alternatively, control device 1b may customize only one of the resin material (the color and the type) and the shape of shaped resin body 220.

It should be considered that the disclosed embodiment is illustrative in all respects and not restrictive. The scope of the present invention is defined by not the above description, but the claims, and it is intended that all modifications within the meaning and scope of the claims are included in the present invention.

REFERENCE SIGNS LIST 1, 1a, 1b: control device; 10: operation unit; 12, 12b: specification setting unit; 14, 14a: mounting program selector; 16: mounting number counter; 18: shaping number counter; 20, 20a: printing program selector; 22: printing number counter; 24, 24b: switching instruction unit; 25: shaping program selector; 40, 40a, 40b: storage; 42, 42b: specification table; 44, 44b: lot management table; 46, 46a: mounting program group; 48: mounting number data; 50: shaping number data; 52, 52a: printing program group; 54: printing number data; 56: combination table; 58: shaping program group; 100, 100b: manufacturing line; 102: mounter; 104: injection molding machine; 105: 3D printer; 106: printing machine; 200: electronic device; 210, 210a to 210g: electronic component; 211: exposed surface; 220: shaped resin body; 221: upper surface; 230: wiring; 300: temporary fixing sheet; 350: molding die; 400, 402: group; 504: ROM; 506: RAM; 510: keyboard; 512: touch panel; 518: communication IF

The invention claimed is:

1. A control device that controls a manufacturing line including: a mounter configured to place at least one electronic component of a designated type at a designated position; a resin shaping machine configured to shape into a shaped resin body in which the at least one electronic component disposed at the designated position is embedded; and a printing machine configured to form a wiring on a surface of the shaped resin body by ejecting conductive ink according to a designated pattern, the control device comprising:

a processor; and
a memory storing a set of instructions which, when executed by the processor, causes the processor to perform operations comprising:
setting a specification of a product to be manufactured through the manufacturing line and a planned number of products;
selecting a mounting program to be used by the mounter from a plurality of mounting programs indicating the type and the position of the at least one electronic component;
counting a mounting number from the mounter using the mounting program, for each of the selected mounting programs;
counting a defective product number of the shaped resin body in which the at least one electronic component disposed using the mounting program is embedded for each of the selected mounting programs;
selecting a printing program to be used by the printing machine from a plurality of printing programs indicating the pattern; and
counting a printing number from the printing machine using the printing program, for each of the selected printing programs, wherein
when a first specification and a first planned number of products are set, and a second specification and a second planned number of products are set, the set of instructions causes the processor to perform operations further comprising:
selecting a first mounting program corresponding to the first specification, and selecting a second mounting program corresponding to the second specification according to matching between the mounting number corresponding to the first mounting program and the first planned number of products; and
selecting a first printing program corresponding to the first specification, and selecting a second printing program corresponding to the second specification according to matching between (i) a sum of the printing number corresponding to the first printing program and the defective product number corresponding to the first mounting program and (ii) the first planned number of products, the plurality of mounting programs include at least two mounting programs corresponding to a third specification, and
when the third specification and a third planned number of products are set, the set of instructions causes the processor to perform operations further comprising arbitrarily selecting one mounting program from the at least two mounting programs, wherein the manufacturing line is controlled based on at least one of the selected mounting program and the selected printing program.

2. The control device according to claim 1, wherein when the selected mounting program indicates the types and the positions of a plurality of electronic components, the set of instructions causes the processor to perform operations further comprising incrementing the mounting number by one, each time of receiving from the mounter a mounting completion signal indicating that dispositions of the plurality of electronic components are completed.

3. The control device according to claim 1, wherein the set of instructions causes the processor to perform operations further comprising incrementing the printing number by one, each time of receiving a printing start signal from the printing machine.

4. The control device according to claim 1, wherein
the plurality of printing programs include at least two printing programs corresponding to the third specification, and
when the third specification and the third planned number of products are set, the set of instructions causes the processor to perform operations further comprising selecting the printing program corresponding to the selected mounting program from the at least two printing programs.

5. The control device according to claim 1, wherein
the at least one electronic component is divided into a plurality of groups, and
the at least two mounting programs differ from each other in dispositions of the plurality of groups.

6. The control device according to claim 1, wherein the resin shaping machine is an injection molding machine using a molding die.

7. The control device according to claim 1, wherein
the resin shaping machine is a 3D printer configured to shape into the shaped resin body having a designated shape,
the set of instructions causes the processor to perform operations further comprising:
selecting a shaping program to be used by the resin shaping machine from a plurality of shaping programs indicating the shape of the shaped resin body; and
counting a shaping number from the resin shaping machine using the shaping program, for each of the selected shaping programs, and
when the first specification and the first planned number of products are set and the second specification and the second planned number of products are set, the set of instructions causes the processor to perform operations further comprising selecting a first shaping program corresponding to the first specification, and selecting a second shaping program corresponding to the second specification according to matching between the shaping number corresponding to the first shaping program and the first planned number of products.

8. The control device according to claim 1, wherein
the resin shaping machine is a 3D printer configured to shape into the shaped resin body of a designated resin material,
the set of instructions causes the processor to perform operations further comprising:
selecting a shaping program to be used by the resin shaping machine from a plurality of shaping programs indicating a type of the resin material for the shaped resin body; and
counting a shaping number from the resin shaping machine using the shaping program, for each of the selected shaping programs, and
when the first specification and the first planned number of products are set and the second specification and the second planned number of products are set, the set of instructions causes the processor to perform operations further comprising selecting a first shaping program corresponding to the first specification, and selecting a second shaping program corresponding to the second specification according to matching between the shaping number corresponding to the first shaping program and the first planned number of products.

9. A control device that controls a manufacturing line including: a mounter configured to place at least one electronic component of a designated type at a designated position; a resin shaping machine configured to shape into a shaped resin body in which the at least one electronic component disposed at the designated position is embedded; and a printing machine configured to form a wiring on a surface of the shaped resin body by ejecting conductive ink according to a designated pattern, the control device comprising:
a processor; and
a memory storing a set of instructions which, when executed by the processor, causes the processor to perform operations comprising:
setting a specification of a product to be manufactured through the manufacturing line and a planned number of products;
selecting a mounting program to be used by the mounter from a plurality of mounting programs indicating the type and the position of the at least one electronic component;
counting a mounting number from the mounter using the mounting program, for each of the selected mounting programs;
counting a defective product number of the shaped resin body in which the at least one electronic component disposed using the mounting program is embedded for each of the selected mounting programs;
selecting a printing program to be used by the printing machine from a plurality of printing programs indicating the pattern; and
counting a printing number from the printing machine using the printing program, for each of the selected printing programs,
wherein when a first specification and a first planned number of products are set and a second specification and a second planned number of products are set, the set of instructions causes the processor to perform operations further comprising:
selecting a first mounting program corresponding to the first specification, and
selecting a second mounting program corresponding to the second specification according to matching between the mounting number corresponding to the first mounting program and the first planned number of products; and
selecting a first printing program corresponding to the first specification, and selecting a second printing program corresponding to the second specification according to matching between (i) a sum of the printing number corresponding to the first printing program and the defective product number corresponding to the first mounting program and (ii) the first planned number of products, the plurality of mounting programs include at least two mounting programs corresponding to a third specification, when the third specification and the third planned number of products are set, the set of instructions causes the processor to perform operations further comprising setting the planned number of products for each of the at least two mounting programs such that a total of the planned numbers of products of the at least two mounting programs becomes a third planned number of products, the at least two mounting programs include a third mounting program and a fourth mounting program, and when the third specification and the third planned number of products are set, the set of instructions causes the processor to perform operations further comprising selecting the third mounting program, and selecting the fourth mounting program according to matching between the mounting number corresponding to the third mounting program and the planned number of products set for the third mounting program, wherein the manufacturing line is controlled based on at least one of the selected mounting program and the selected printing program.

10. The control device according to claim 9, wherein
the plurality of printing programs include a third printing program corresponding to the third mounting program and a fourth printing program corresponding to the fourth mounting program, and
when the third specification and the third planned number of products are set, the set of instructions causes the processor to perform operations further comprising selecting the third printing program, and selecting the fourth printing program according to matching between (i) a sum of the printing number corresponding to the third printing program and the defective product number corresponding to the third mounting program and (ii) the planned number of products set for the third mounting program.

11. The control device according to claim 9, wherein when the selected mounting program indicates the types and the positions of a plurality of electronic components, the set of instructions causes the processor to perform operations further comprising incrementing the mounting number by one, each time of receiving from the mounter a mounting completion signal indicating that dispositions of the plurality of electronic components are completed.

12. The control device according to claim 9, wherein the set of instructions causes the processor to perform operations further comprising incrementing the printing number by one, each time of receiving a printing start signal from the printing machine.

13. The control device according to claim 9, wherein
the at least one electronic component is divided into a plurality of groups, and
the at least two mounting programs differ from each other in dispositions of the plurality of groups.

14. The control device according to claim 9, wherein the resin shaping machine is an injection molding machine using a molding die.

15. The control device according to claim 9, wherein
the resin shaping machine is a 3D printer configured to shape into the shaped resin body having a designated shape,
the set of instructions causes the processor to perform operations further comprising:
selecting a shaping program to be used by the resin shaping machine from a plurality of shaping programs indicating the shape of the shaped resin body; and
counting a shaping number from the resin shaping machine using the shaping program, for each of the selected shaping programs, and
when the first specification and the first planned number of products are set and the second specification and the second planned number of products are set, the set of instructions causes the processor to perform operations further comprising selecting a first shaping program corresponding to the first specification, and selecting a second shaping program corresponding to the second specification according to matching between the shaping number corresponding to the first shaping program and the first planned number of products.

16. The control device according to claim 9, wherein
the resin shaping machine is a 3D printer configured to shape into the shaped resin body of a designated resin material,
the set of instructions causes the processor to perform operations further comprising:
selecting a shaping program to be used by the resin shaping machine from a plurality of shaping programs indicating a type of the resin material for the shaped resin body; and
the set of instructions causes the processor to perform operations further comprising counting a shaping number from the resin shaping machine using the shaping program, for each of the selected shaping programs, and
when the first specification and the first planned number of products are set and the second specification and the second planned number of products are set, the set of instructions causes the processor to perform operations further comprising selecting a first shaping program corresponding to the first specification, and selecting a second shaping program corresponding to the second specification according to matching between the shaping number corresponding to the first shaping program and the first planned number of products.

* * * * *